(12) United States Patent
Pfenninger et al.

(10) Patent No.: US 8,664,513 B2
(45) Date of Patent: *Mar. 4, 2014

(54) SOLAR MODULES WITH ENHANCED EFFICIENCIES VIA USE OF SPECTRAL CONCENTRATORS

(75) Inventors: William Matthew Pfenninger, Fremont, CA (US); John Midgley, San Carlos, CA (US); Nemanja Vockic, San Jose, CA (US); John Kenney, Palo Alto, CA (US)

(73) Assignee: OMNIPV, Inc., Belmont, CA (US)

( * ) Notice: Subject to any disclaimer, the term of this patent is extended or adjusted under 35 U.S.C. 154(b) by 1294 days.

This patent is subject to a terminal disclaimer.

(21) Appl. No.: 12/248,747

(22) Filed: Oct. 9, 2008

(65) Prior Publication Data

US 2009/0095341 A1    Apr. 16, 2009

Related U.S. Application Data

(60) Provisional application No. 60/979,696, filed on Oct. 12, 2007.

(51) Int. Cl.
*H02N 6/00* (2006.01)
*H01L 31/042* (2006.01)

(52) U.S. Cl.
USPC .................................................. 136/246

(58) Field of Classification Search
USPC ................................. 136/246, 251
See application file for complete search history.

(56) References Cited

U.S. PATENT DOCUMENTS

| | | | |
|---|---|---|---|
| 4,227,939 A | 10/1980 | Zewail et al. | |
| 4,322,261 A * | 3/1982 | Dubois | 156/280 |
| 4,324,946 A | 4/1982 | Gravisse | |
| 4,663,495 A * | 5/1987 | Berman et al. | 136/248 |
| 5,458,694 A | 10/1995 | Nuyen | |
| 6,570,083 B2 | 5/2003 | Gravisse et al. | |
| 7,169,669 B2 | 1/2007 | Blakers et al. | |
| 2005/0272225 A1 | 12/2005 | Weber et al. | |
| 2008/0116785 A1* | 5/2008 | Ohno et al. | 313/503 |
| 2008/0223438 A1 | 9/2008 | Xiang et al. | |

FOREIGN PATENT DOCUMENTS

| | | |
|---|---|---|
| JP | 11-214720 A | 8/1999 |
| JP | 2004-039695 A | 2/2004 |
| JP | 2006-128156 A | 5/2006 |

(Continued)

OTHER PUBLICATIONS

Sheng, Ping, "Optical Absorption of Thin Film on a Lambertian Reflector Substrate", May 1984, IEEE Transactions on Electron Devices, vol. Ed-31, No. 5, pp. 634-636.*

(Continued)

*Primary Examiner* — Tamir Ayad
(74) *Attorney, Agent, or Firm* — Foley & Lardner LLP; Cliff Z. Liu

(57) ABSTRACT

Described herein are solar modules including spectral concentrators. In one embodiment, a solar module includes an active layer including a set of photovoltaic cells. The solar module also includes a spectral concentrator optically coupled to the active layer and including a luminescent material that exhibits photoluminescence in response to incident solar radiation. The photoluminescence has: (a) a quantum efficiency of at least 30 percent; (b) a spectral width no greater than 100 nm at Full Width at Half Maximum; and (c) a peak emission wavelength in the near infrared range.

21 Claims, 14 Drawing Sheets

(56) References Cited

FOREIGN PATENT DOCUMENTS

| WO | WO 84/03553 | | 9/1984 |
| WO | WO2006/057357 | * | 6/2006 |
| WO | WO 2008/157621 A2 | | 12/2008 |
| WO | PCT/US2008/079347 | | 4/2009 |

OTHER PUBLICATIONS

Imenes, A.G., et al., "Spectral beam splitting technology for increased conversion efficiency in soalr concentrating systems: a review", 2004, Solar Energy Materials & Solar Cells 84, pp. 19-69.*

Trupke, T. et al., "Improving solar cell efficiencies by down-conversion of high-energy photons", Aug. 2002, Journal of Applied Physics, vol. 92, No. 3, pp. 1668-1674.*

Beard et al., "Multiple Exciton Generation in Colloidal Silicon Nanocrystals," Nano Letters, published on the web on Jul. 24, 2007.

Ema et al., "Huge Exchange Energy and Fine Structure of Excitons in an Organic-Inorganic Quantum Well," Physical Review B, vol. 73, pp. 241310-1 to 241310-4 (2006).

Kagan et al., "Organic-Inorganic Hybrid Materials as Semiconducting Channels in Thin-Film Field-Effect Transistors," Science, vol. 286, pp. 945-947 (1999).

Knutson et al., "Tuning the Bandgap in Hybrid Tin Iodide Perovskite Semiconductors Using Structural Templating," Inorg. Chem., vol. 44, (2005) pp. 4699-4705.

Mitzi et al., "Conducting Layered Organic-inorganic Halides Containing 110-Oriented Perovskite Sheets," Science. vol. 267, (1995) pp. 1473-1476.

Mitzi, "Solution-processed Inorganic Semiconductors," J. Mater. Chem., vol. 14, (2004) pp. 2355-2365.

Salav et al., "Luminescent Layers for Enhanced Silicon Solar Cell Performance: Up-Conversion," Solar Energy Materials & Solar Cells, vol. 91, pp. 829-842 (2007).

Schwartz, B.A., A.H. Zewali, "Photon Trapping and Energy Transfer in Multiple-Dye Plastic Matrices: an Efficient Solar-Engery Concentrator," Optics Letters, vol. 1, p. 73 (1977).

Symonds et al., "Emission of Hybrid Organic-inorganic Exciton/Plasmon Mixed States," Applied Physics Letters, vol. 90, 091107 (2007).

Tanaka et al., "Comparative Study on the Excitons in Lead-halide-based Perovskite type crystals $CH_3NH_3PdBr_3$ $CH_3NH_3Pbl_3$," Solid State Communications, vol. 127, pp. 619-623 (2003).

van Sark, W.G.J.H.M. et al., "Enhancing Solar Cell Efficiency by Using Spectral Converters," Solar Energy Materials & Solar Cells, vol. 87, pp. 395-409 (2005).

Zoubi et al., "Polarization Mixing in Hybrid Organic-Inorganic Microcavities," Organic Electronics, vol. 8, pp. 127-135 (2007).

PCT/US2006/079347. Applicant: Ultradots, Inc. Written Opinion/International Preliminary Report on Patentability (Apr. 13, 2010).

* cited by examiner

SOLAR MODULES WITH ENHANCED EFFICIENCIES VIA USE OF SPECTRAL CONCENTRATORS

CROSS REFERENCE TO RELATED APPLICATION

This application claims the benefit of U.S. Provisional Application Ser. No. 60/979,696, filed on Oct. 12, 2007, the disclosure of which is incorporated herein by reference in its entirety.

FIELD OF THE INVENTION

The invention relates generally to solar modules. More particularly, the invention relates to solar modules including spectral concentrators.

BACKGROUND

A solar module operates to convert energy from solar radiation into electricity, which is delivered to an external load to perform useful work. A solar module typically includes a set of photovoltaic ("PV") cells, which can be connected in parallel, in series, or a combination thereof. The most common type of PV cell is a p-n junction device based on crystalline silicon. Other types of PV cells can be based on amorphous silicon, polycrystalline silicon, germanium, organic materials, and Group III-V semiconductor materials, such as gallium arsenide.

The solar module industry is relatively cost sensitive, and the high cost of starting silicon wafers is one of the key challenges associated with conventional solar modules. Attempts have been made to reduce the amount of silicon through the use of thin slices or strips of silicon. In particular, micromachining operations can be performed on a silicon wafer to form numerous silicon slices, each of which can be further processed to form a PV cell. In forming PV cells, each silicon slice can be rotated by about 90°, thereby yielding a gain in overall active surface area relative to a starting silicon wafer. The use of silicon slices allows a significant reduction in silicon consumption, which, in turn, allows a significant reduction in manufacturing costs of solar modules.

While the use of silicon slices provides the advantages noted above, the resulting solar modules typically suffer limitations on the ability to efficiently convert solar radiation into electrical energy. The inability to convert the total incident solar energy into useful electrical energy represents a loss or inefficiency of the solar modules. One significant loss mechanism typically derives from a mismatch between an incident solar spectrum and an absorption spectrum of PV cells. In the case of a PV cell based on silicon, photons with energy greater than a bandgap energy of silicon can lead to the production of photo-excited electron-hole pairs with excess energy. Such excess energy is typically not converted into electrical energy but is rather typically lost as heat through hot charge carrier relaxation or thermalization. This heat can raise the temperature of the PV cell and, as a result, can reduce the efficiency of the PV cell in terms of its ability to produce electron-hole pairs. In some instances, the efficiency of the PV cell can decrease by about 0.5 percent for every 1° C. rise in temperature. In conjunction with these thermalization losses, photons with energy less than the bandgap energy of silicon are typically not absorbed and, thus, typically do not contribute to the conversion into electrical energy. As a result, a small range of the incident solar spectrum near the bandgap energy of silicon can be efficiently converted into useful electrical energy.

It is against this background that a need arose to develop the solar modules and related methods described herein.

SUMMARY

Certain aspects of the invention relate to solar modules having enhanced efficiencies with respect to conversion of incident solar radiation to useful electrical energy. In one embodiment, a solar module includes an active layer including a set of photovoltaic cells. The solar module also includes a spectral concentrator optically coupled to the active layer and including a luminescent material that exhibits photoluminescence in response to incident solar radiation. The photoluminescence has: (a) a quantum efficiency of at least 30 percent; (b) a spectral width no greater than 100 nanometer at Full Width at Half Maximum; and (c) a peak emission wavelength in the near infrared range.

In another embodiment, the solar module includes an active layer including a set of photovoltaic cells. The solar module also includes a first substrate layer adjacent to the active layer and including a first surface facing away from the active layer. The solar module also includes a second substrate layer adjacent to the active layer and including a second surface facing away from the active layer. The active layer is disposed between the first substrate layer and the second substrate layer. The solar nodule further includes a first luminescent layer adjacent to the first surface of the first substrate layer and a second luminescent layer adjacent to the second surface of the second substrate layer. The first luminescent layer is configured to convert a first fraction of incident solar radiation into first emitted radiation that is substantially monochromatic and is directed towards the active layer. The second luminescent layer is configured to convert a second fraction of the incident solar radiation into second emitted radiation that is substantially monochromatic and is directed towards the active layer.

In a further embodiment, the solar module includes a substrate layer including a first surface and a second surface. The solar module also includes an anti-reflection coating adjacent to the first surface of the substrate layer. The solar module further includes an active layer adjacent to the second surface of the substrate layer. The active layer includes an encapsulant including a luminescent material that exhibits photoluminescence in response to incident solar radiation. The photoluminescence has: (a) a spectral width in the range of 20 nanometer to 120 nanometer at Full Width at Half Maximum; and (b) a peak emission wavelength in the range of 900 nanometer to 1 micrometer. The active layer also includes a set of photovoltaic cells disposed within the encapsulant.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Overview

Figure 1:
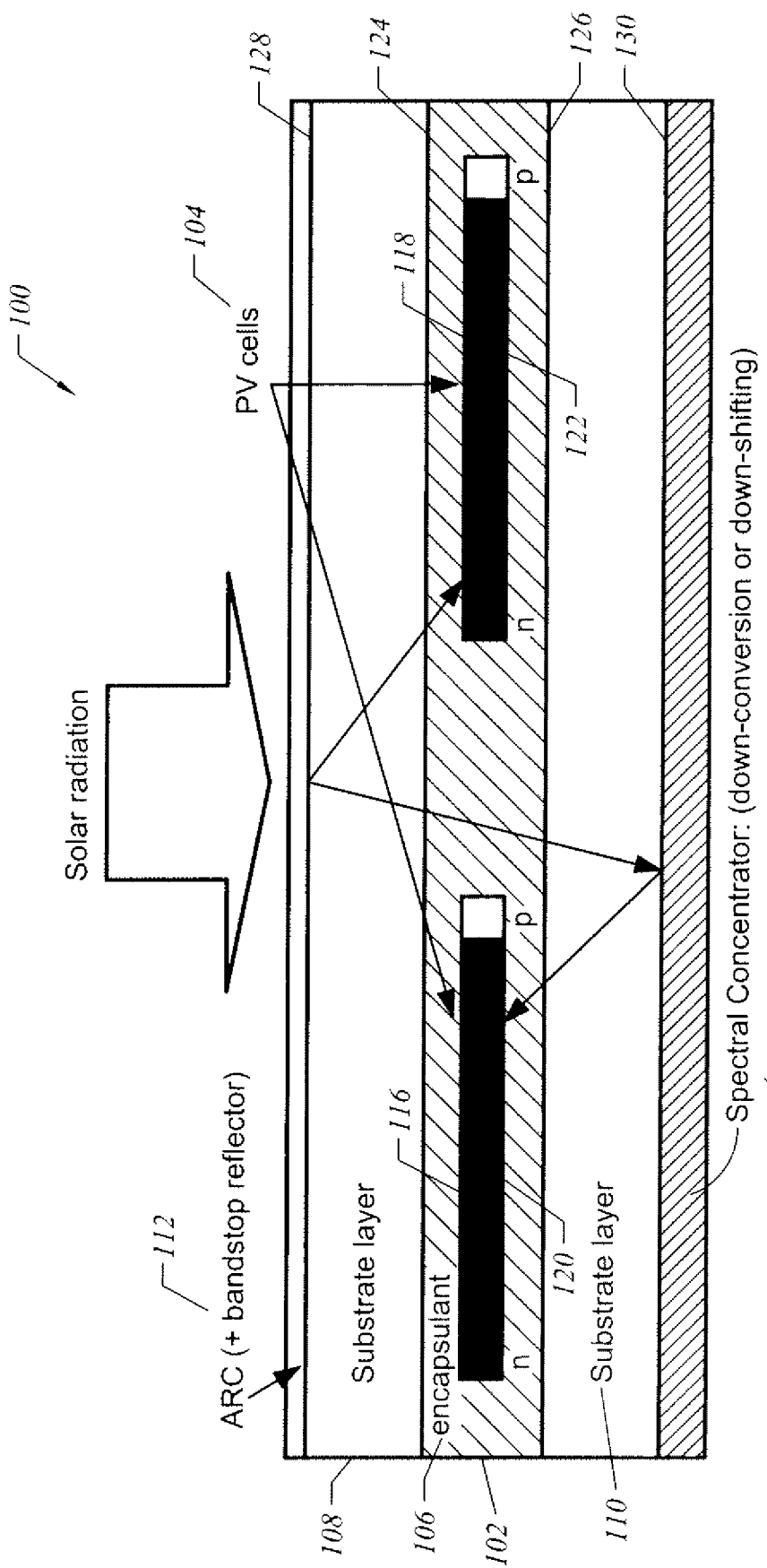
FIG. 1 illustrates a solar module implemented in accordance with an embodiment of the invention.

Embodiments of the invention relate to solar modules having enhanced efficiencies with respect to conversion of incident solar radiation to useful electrical energy. For some embodiments, a solar module includes a set of PV cells and a spectral concentrator that is optically coupled to the PV cells. By converting a wide range of energies of incident solar radiation to a narrow band of energies matched to a bandgap energy of the PV cells, the spectral concentrator allows significant improvements in efficiency to be achieved. In addition, the design of the PV cells can be optimized or otherwise tailored based on this narrow band of energies.

DEFINITIONS

The following definitions apply to some of the elements described with regard to some embodiments of the invention. These definitions may likewise be expanded upon herein.

As used herein, the singular terms "a," "an," and "the" include plural referents unless the context clearly dictates otherwise. Thus, for example, reference to a luminescent material can include multiple luminescent materials unless the context clearly dictates otherwise.

As used herein, the term "set" refers to a collection of one or more elements. Thus, for example, a set of PV cells can include a single PV cell or multiple PV cells. Elements of a set can also be referred to as members of the set. Elements of a set can be the same or different. In some instances, elements of a set can share one or more common characteristics.

As used herein, the terms "optional" and "optionally" mean that the subsequently described event or circumstance may or may not occur and that the description includes instances where the event or circumstance occurs and instances in which it does not.

As used herein, the term "adjacent" refers to being near or adjoining. Adjacent elements can be spaced apart from one another or can be in actual or direct contact with one another. In some instances, adjacent elements can be coupled to one another or can be formed integrally with one another.

As used herein, the terms "top" and "bottom" refer to a relative orientation of a set of elements, such as in accordance with the drawings, but do not require a particular orientation of those elements during manufacturing or use.

As used herein, the term "ultraviolet range" refers to a range of wavelengths from about 5 nanometer ("nm") to about 400 nm.

As used herein, the term "visible range" refers to a range of wavelengths from about 400 nm to about 700 nm.

As used herein, the term "infrared range" refers to a range of wavelengths from about 700 nm to about 2 millimeter ("mm"). The infrared range includes the "near infrared range," which refers to a range of wavelengths from about 700 nm to about 5 micrometer ("µm"), the "middle infrared range," which refers to a range of wavelengths from about 5 µm to about 30 µm, and the "far infrared range," which refers to a range of wavelengths from about 30 µm to about 2 mm.

As used herein, the terms "reflection," "reflect," and "reflective" refer to a bending or a deflection of light, and the term "reflector" refers to an element that causes, induces, or is otherwise involved in such bending or deflection. A bending or a deflection of light can be substantially in a single direction, such as in the case of specular reflection, or can be in multiple directions, such as in the case of diffuse reflection or scattering. In general, light incident upon a material and light reflected from the material can have wavelengths that are the same or different.

As used herein, the terms "luminescence," "luminesce," and "luminescent" refer to an emission of light in response to an energy excitation. Luminescence can occur based on relaxation from excited electronic states of atoms or molecules and can include, for example, chemiluminescence, electroluminescence, photoluminescence, thermoluminescence, triboluminescence, and combinations thereof. For example, in the case of photoluminescence, which can include fluorescence and phosphorescence, an excited electronic state can be produced based on a light excitation, such as absorption of light. In general, light incident upon a material and light emitted by the material can have wavelengths that are the same or different.

As used herein with respect to photoluminescence, the term "quantum efficiency" refers to a ratio of the number of output photons to the number of input photons. Quantum efficiency of a photoluminescent material can refer to a ratio of the number of photons emitted by the photoluminescent material to the number of photons absorbed by the photoluminescent material.

As used herein, the term "absorption spectrum" refers to a representation of absorption of light over a range of wavelengths. In some instances, an absorption spectrum can refer to a plot of absorbance (or transmittance) of a material as a function of wavelength of light incident upon the material.

As used herein, the term "emission spectrum" refers to a representation of emission of light over a range of wavelengths. In some instances, an emission spectrum can refer to a plot of intensity of light emitted by a material as a function of wavelength of the emitted light.

As used herein, the term "excitation spectrum" refers to another representation of emission of light over a range of wavelengths. In some instances, an excitation spectrum can refer to a plot of intensity of light emitted by a material as a function of wavelength of light incident upon the material.

As used herein, the term "Full Width at Half Maximum" or "FWHM" refers to a measure of spectral width. In the case of an emission spectrum, a FWHM can refer to a width of the emission spectrum at half of a peak intensity value.

As used herein with respect to an absorption spectrum or an excitation spectrum, the term "substantially flat" refers to being substantially invariant with respect to a change in wavelength. In some instances, a spectrum can be referred to as being substantially flat over a range of wavelengths if absorbance or intensity values within that range of wavelengths exhibit a standard deviation of less than 20 percent with respect to an average intensity value, such as less than 10 percent or less than 5 percent.

As used herein with respect to an emission spectrum, the term "substantially monochromatic" refers to emission of light over a narrow range of wavelengths. In some instances, an emission spectrum can be referred to as being substantially monochromatic if a spectral width is no greater than 120 nm at FWHM, such as no greater than 100 nm at FWHM, no greater than 80 nm at FWHM, or no greater than 50 nm at FWHM.

As used herein, the term "nanometer range" or "nm range" refers to a range of dimensions from about 1 nm to about 1 μm. The nm range includes the "lower nm range," which refers to a range of dimensions from about 1 nm to about 10 nm, the "middle am range," which refers to a range of dimensions from about 10 nm to about 100 nm, and the "upper nm range," which refers to a range of dimensions from about 100 nm to about 1 μm.

As used herein, the term "size" refers to a characteristic dimension. In the case of a particle that is spherical, a size of the particle can refer to a diameter of the particle. In the case of a particle that is non-spherical, a size of the particle can refer to an average of various orthogonal dimensions of the particle. Thus, for example, a size of a particle that is a spheroidal can refer to an average of a major axis and a minor axis of the particle. When referring to a set of particles as having a particular size, it is contemplated that the particles can have a distribution of sizes around that size. Thus, as used herein, a size of a set of particles can refer to a typical size of a distribution of sizes, such as an average size, a median size, or a peak size.

As used herein, the term "nanoparticle" refers to a particle that has a size in the am range. A nanoparticle can have any of a variety of shapes, such as box-shaped, cube-shaped, cylindrical, disk-shaped, spherical, spheroidal, tetrahedral, tripodal, tube-shaped, pyramid-shaped, or any other regular or irregular shape, and can be formed from any of a variety of materials. In some instances, a nanoparticle can include a core formed from a first material, which core can be optionally surrounded by a coating or a shell formed from a second material. The first material and the second material can be the same or different. Depending on the configuration of a nanoparticle, the nanoparticle can exhibit size dependent characteristics associated with quantum confinement. However, it is also contemplated that a nanoparticle can substantially lack size dependent characteristics associated with quantum confinement or can exhibit such size dependent characteristics to a low degree.

As used herein, the term "dopant" refers to a chemical entity that is present in a material as an additive or an impurity. In some instances, the presence of a dopant in a material call alter a set of characteristics of the material, such as its chemical, magnetic, electronic, or optical characteristics.

Solar Modules

FIG. 1 is a cross-sectional view of a portion of a solar module 100 implemented in accordance with al embodiment of the invention. The solar module 100 includes an active layer 102, which includes a set of PV cells 104 that are spaced apart from one another and are embedded within a suitable encapsulant 106, such as a polymer that is optically transparent or translucent. In the illustrated embodiment, the PV cells 104 are p-n junction devices formed from thin slices or strips of crystalline silicon. However, the PV cells 104 can also be formed from another suitable photoactive material. Each of the PV cells 104 can have a thickness in the range of about 10 μm to about 100 μm, a width in the range of about 0.5 mm to about 3 mm, and a length in the range of about 10 mm to about 200 mm. As illustrated in FIG. 1, each of the PV cells 104 is bifacial and, thus, is able to accept and absorb light at both a top surface 116 or 118 and a bottom surface 120 or 122, although other surfaces of the PV cells 104 can also be involved. The orientation of the PV cells 104 within the active layer 102 is such that junction regions of the PV cells 104 are substantially perpendicular and substantially aligned with respect to light striking the top surfaces 116 and 118 and the bottom surfaces 120 and 122. This orientation of the PV cells 104 can enhance uniformity of optical excitation across the junction regions and enhance solar energy conversion efficiencies.

As illustrated in FIG. 1, the active layer 102 is sandwiched by a pair of substrate layers 108 and 110, which are formed from glass or another suitable material that is optically transparent or translucent. In particular, the substrate layer 108 is adjacent to a top surface 124 of the active layer 102, while the substrate layer 110 is adjacent to a bottom surface 126 of the active layer 102. An anti-reflection coating ("ARC") 112 is formed adjacent to a top surface 128 of the substrate layer 108 to reduce reflection of incident solar radiation. The ARC 112 also includes a bandstop filter or reflector, which inhibits escape of emitted radiation from the solar module 100 as further described below.

In the illustrated embodiment, the solar module 100 also includes a spectral concentrator 114, which is formed as a set of coatings, films, or layers adjacent to a bottom surface 130 of the substrate layer 110. The spectral concentrator 114 includes a set of luminescent materials that convert a fraction of a solar spectrum into a relatively narrow, substantially monochromatic energy band that is matched to an absorption spectrum of the PV cells 104. In this manner, the spectral concentrator 114 performs spectral concentration by converting a relatively wide range of energies of solar radiation into an energy hand that is close to the bandgap energy of silicon, or another photoactive material forming the PV cells 104. In turn, the substantially monochromatic light emitted from the spectral concentrator 114 can be efficiently absorbed within the junction regions of the PV cells 104. By matching the energy of the emitted light with the bandgap energy of the PV cells 104, much higher solar energy conversion efficiencies of 90 percent or more can be achieved. Also, by selecting a luminescent material having a high absorption coefficient for solar radiation, a thickness of the spectral concentrator 114 can be reduced, such as in the range of about 0.1 μm to about 10 μm, in the range of about 0.2 μm to about 1 μm, or in the range of about 0.2 μm to about 0.5 μm.

During operation of the solar module 100, a certain fraction of incident solar radiation passes through the substrate layer 108 and strikes the top surfaces 116 and 118 of the PV cells 104, which absorb and convert this solar radiation into electricity. A remaining fraction of the solar radiation, which passes between the PV cells 104 and through the substrate layer 110, strikes the spectral concentrator 114, which absorbs this solar radiation and emits radiation in a substantially monochromatic energy band. In particular, the spectral concentrator 114 is configured to perform down-conversion with a bandgap energy $E_g$ close to a bandgap energy of the PV cells 104. Solar radiation with energies at or higher than the bandgap energy $E_g$ is absorbed and converted into emitted radiation with lower energies that match the bandgap energy of the PV cells 104. In this manner, thermalization can mostly occur within the spectral concentrator 114, rather than within the PV cells 104. Emitted radiation from the spectral concentrator 114 is directed upwards and strikes the bottom surfaces 120 and 122 of the PV cells 104, which absorb and convert this emitted radiation into electricity. Emitted radiation that passes between the PV cells 104 is reflected as a result of the bandstop reflector included in the ARC 112, and this reflected radiation can strike the top surfaces 116 and 118 of the PV cells 104 as described above. In the illustrated embodiment, the PV cells 104 are optimized to operate with respect to substantially monochromatic, emitted radiation, but can also operate efficiently with respect to incident solar radiation.

Figure 2:
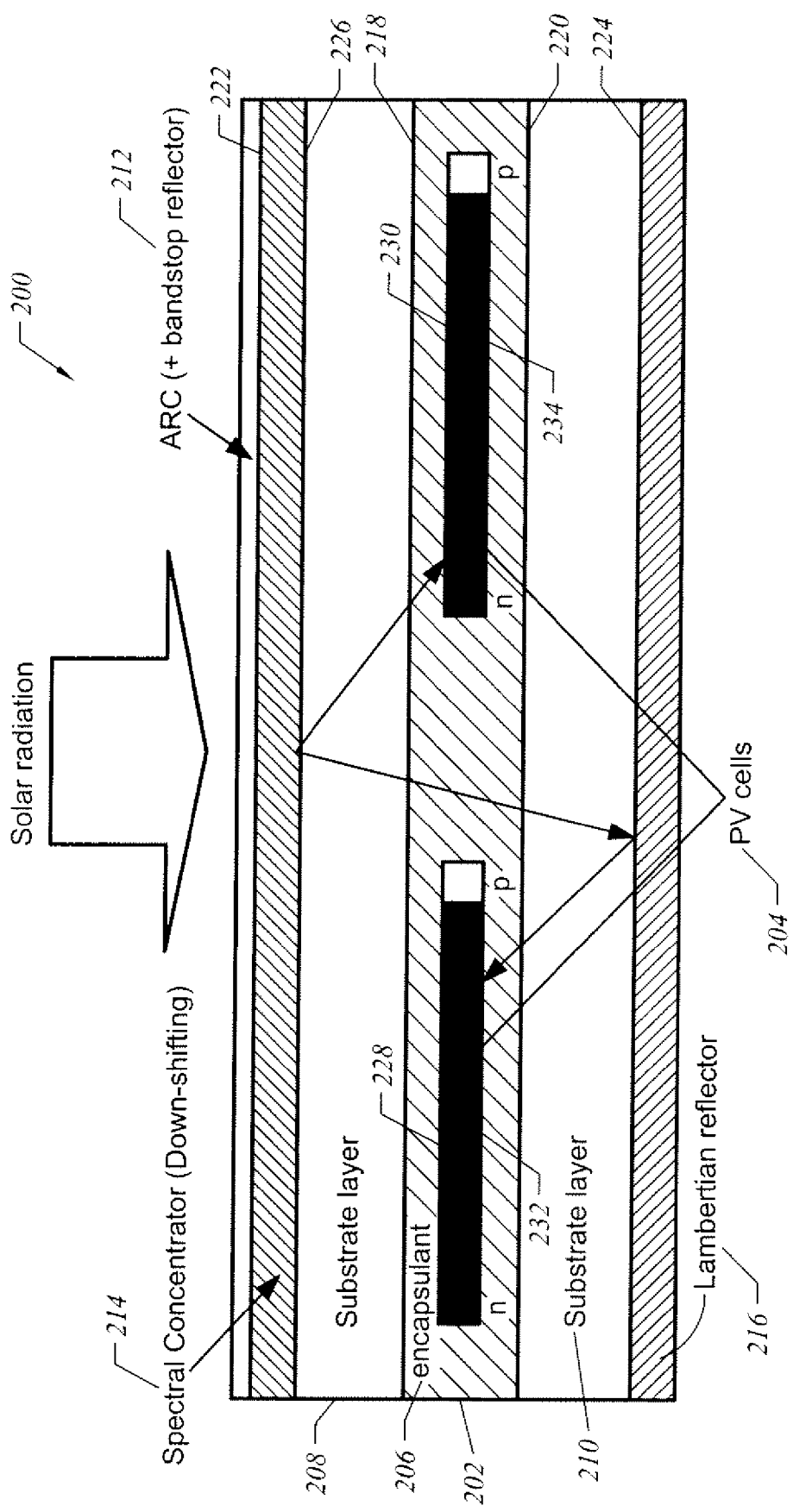
FIG. 2 illustrates a solar module implemented in accordance with another embodiment of the invention.

FIG. 2 is a cross-sectional view of a portion of a solar module 200 implemented in accordance with another embodiment of the invention. The solar module 200 includes an active layer 202, which includes a set of PV cells 204 that are spaced apart from one another and are embedded within a suitable encapsulant 206. As illustrated in FIG. 2, the active layer 202 is sandwiched by a pair of substrate layers 208 and 210, which are adjacent to a top surface 218 and a bottom surface 220 of the active layer 202, respectively. An ARC 212, which includes a bandstop reflector, is formed adjacent to a top surface 222 of a spectral concentrator 214, which is further described below. The ARC 212 along with the bandstop reflector operate to reduce reflection of incident solar radiation and to inhibit escape of emitted radiation from the solar module 200. A Lambertian reflector 216, such as white paint or another suitable omni-reflective material, is formed as a coating, film, or layer adjacent to a bottom surface 224 of the substrate layer 210. Certain aspects of the solar module 200 can be implemented in a similar manner as described above for the solar module 100, and, therefore, are not further described herein.

As illustrated in FIG. 2, the solar module 200 also includes the spectral concentrator 214, which is formed as a set of coatings, films, or layers adjacent to a top surface 226 of the substrate layer 208. During operation of the solar module 200, incident solar radiation strikes the spectral concentrator 214, which absorbs this solar radiation and emits radiation in a substantially monochromatic energy band. In particular, the spectral concentrator 214 is configured to perform down-conversion with a bandgap energy $E_g$ close to a bandgap energy of the PV cells 204. Solar radiation with energies at or higher than the bandgap energy $E_g$ is absorbed and converted into emitted radiation with lower energies that match the bandgap energy of the PV cells 204. In this manner, thermalization can mostly occur within the spectral concentrator 214, rather than within the PV cells 204. Emitted radiation from the spectral concentrator 214 is directed downwards, and a certain fraction of the emitted radiation strikes top surfaces 228 and 230 of the PV cells 204, which absorb and convert this emitted radiation into electricity. A remaining fraction of the emitted radiation, which passes between the PV cells 204 and through the substrate layer 210, strikes the Lambertian reflector 216, which reflects this emitted radiation. Reflected radiation is directed upwards and strikes bottom surfaces 232 and 234 of the PV cells 204, which absorb and convert this reflected radiation into electricity. Reflected radiation that passes between the PV cells 204 is again reflected as a result of the bandstop reflector included in the ARC 212, and this reflected radiation can strike the top surfaces 228 and 230 of the PV cells 204 as described above. In the illustrated embodiment, the PV cells 204 are optimized to operate with respect to substantially monochromatic, emitted radiation.

Figure 3:
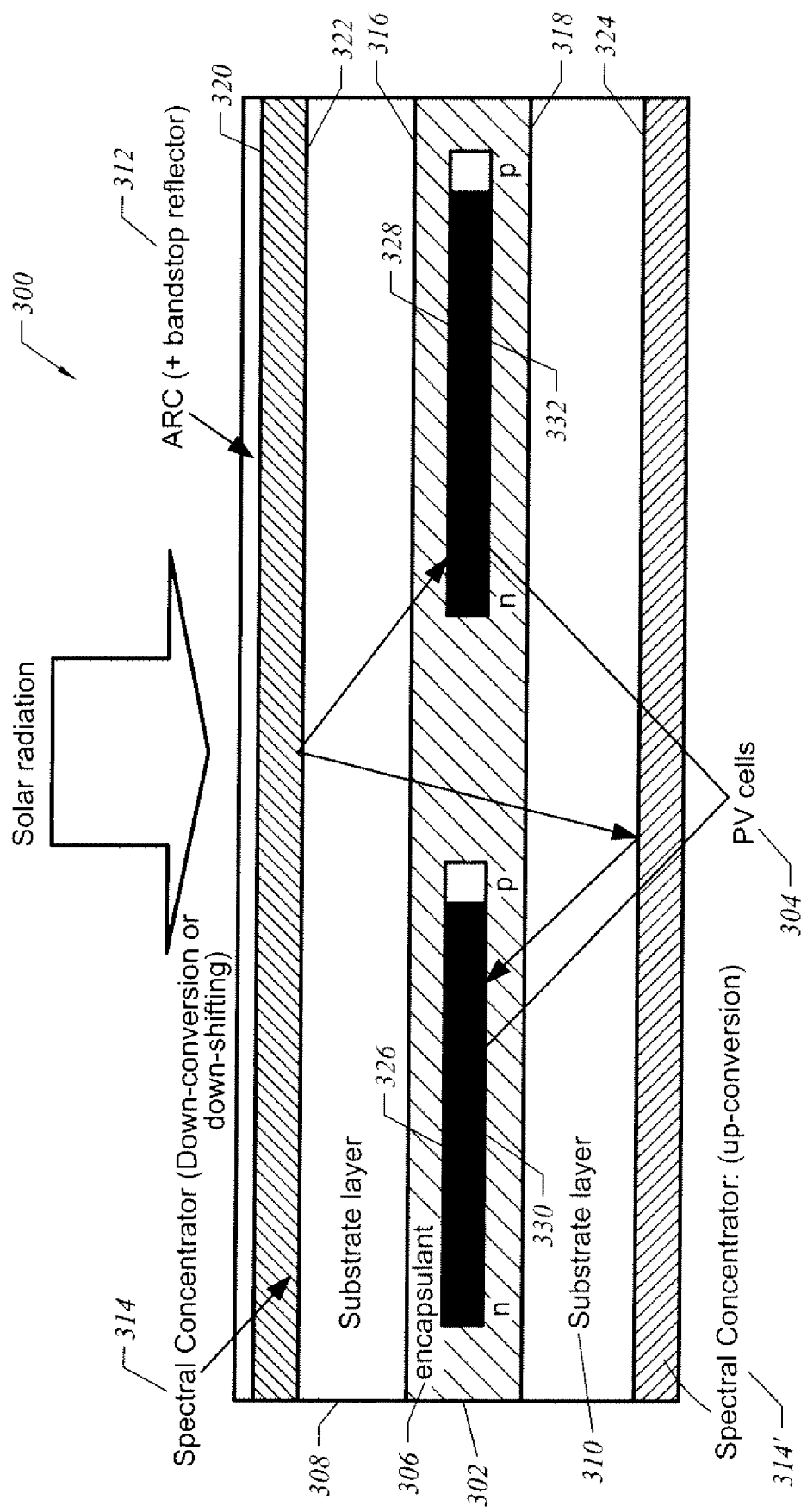
FIG. 3 illustrates a solar module implemented in accordance with another embodiment of the invention.

FIG. 3 is a cross-sectional view of a portion of a solar module 300 implemented in accordance with another embodiment of the invention. The solar module 300 includes an active layer 302, which includes a set of PV cells 304 that are spaced apart from one another and are embedded within a suitable encapsulant 306. As illustrated in FIG. 3, the active layer 302 is sandwiched by a pair of substrate layers 308 and 310, which are adjacent to a top surface 316 and a bottom surface 318 of the active layer 302, respectively. An ARC 312, which includes a bandstop reflector, is formed adjacent to a top surface 320 of a spectral concentrator 314, which is further described below. The ARC 312 along with the bandstop reflector operate to reduce reflection of incident solar radiation and to inhibit escape of emitted radiation from the solar module 300. Certain aspects of the solar module 300 can be implemented in a similar manner as described above for the solar module 100, and, therefore, are not further described herein.

As illustrated in FIG. 3, the solar module 300 also includes a pair of spectral concentrators, namely the spectral concentrator 314 and a spectral concentrator 314'. The spectral concentrator 314 is formed as a set of coatings, films, or layers adjacent to a top surface 322 of the substrate layer 308, and the spectral concentrator 314' is formed as a set of coatings, films, or layers adjacent to a bottom surface 324 of the substrate layer 310. During operation of the solar module 300, incident solar radiation strikes the spectral concentrator 314, which absorbs a certain fraction of this solar radiation and emits radiation in a substantially monochromatic energy band. In particular, the spectral concentrator 314 is configured to perform down-conversion with a bandgap energy $E_{g1}$ close to a bandgap energy of the PV cells 304. Solar radiation with energies at or higher than the bandgap energy $E_{g1}$ is absorbed and converted into emitted radiation with lower energies that match the bandgap energy of the PV cells 304. Solar radiation with energies lower than the bandgap energy $E_{g1}$ is not absorbed by the spectral concentrator 314 and passes through the spectral concentrator 314. Emitted radiation from the spectral concentrator 314 is directed downwards, and the emitted radiation strikes top surfaces 326 and 328 of the PV cells 304, which absorb and convert this emitted radiation into electricity. A remaining fraction of the lower energy, incident solar radiation, which passes between the PV cells 304 and through the substrate layer 310, strikes the spectral concentrator 314', which absorbs this solar radiation and emits radiation in a substantially monochromatic energy band. In particular, the spectral concentrator 314' is configured to perform up-conversion and emit light with a bandgap energy $E_{g2}$ also close to the bandgap energy of the PV cells 304. In other words, the bandgap energy $E_{g2}$ is substantially the same as the bandgap energy $E_{g1}$, and solar radiation with lower energies are absorbed and converted by the spectral concentrator 314' into emitted radiation with higher energies that match the bandgap energy of the PV cells 304. Emitted radiation from the spectral concentrator 314' is directed upwards, and the emitted radiation strikes bottom surfaces 330 and 332 of the PV cells 304, which absorb and convert this emitted radiation into electricity. In this manner, thermalization can mostly occur within the spectral concentrators 314 and 314', rather than within the PV cells 304. Emitted radiation that passes between the PV cells 304 is reflected as a result of the bandstop reflector included in the ARC 312, and this reflected radiation can strike the top surfaces 326 and 328 of the PV cells 304 as described above. In the illustrated embodiment, the PV cells 304 are optimized to operate with respect to substantially monochromatic, emitted radiation.

Figure 4:
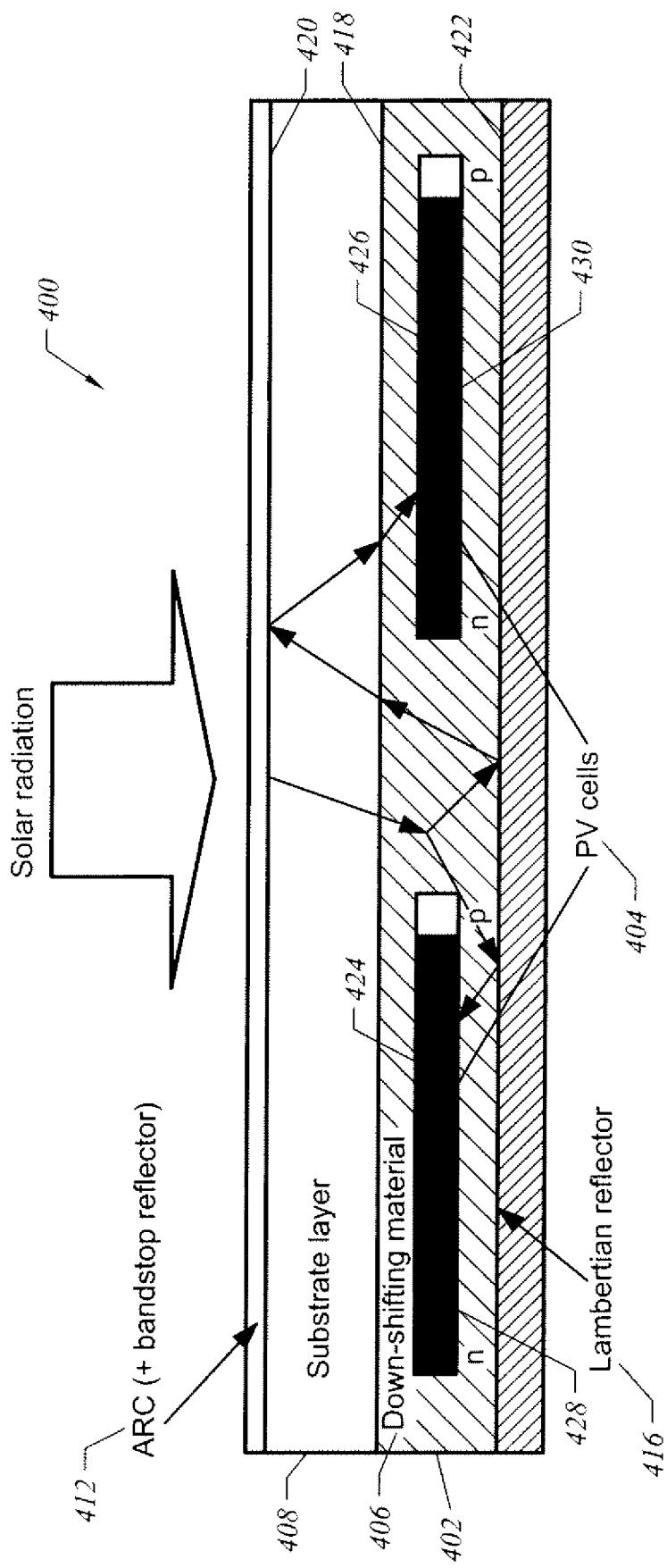
FIG. 4 illustrates a solar module implemented in accordance with another embodiment of the invention.

FIG. 4 is a cross-sectional view of a portion of a solar module 400 implemented in accordance with another embodiment of the invention. The solar module 400 includes an active layer 402, which includes a set of PV cells 404 that are spaced apart from one another and are embedded within a suitable encapsulant 406. As illustrated in FIG. 4, the active layer 402 is formed adjacent to a bottom surface 418 of a substrate layer 408. An ARC 412, which includes a bandstop reflector, is formed adjacent to a top surface 420 of the substrate layer 408 to reduce reflection of incident solar radiation and to inhibit escape of emitted radiation from the solar module 400. A Lambertian reflector 416 is formed as a coating, film, or layer adjacent to a bottom surface 422 of the active layer 402. Certain aspects of the solar module 400 can be implemented in a similar manner as described above for the solar module 100, and, therefore, are not further described herein.

As illustrated in FIG. 4, the encapsulant 406 includes a set of luminescent materials that convert a fraction of a solar spectrum into a relatively narrow, substantially monochromatic energy band that is matched to an absorption spectrum of the PV cells 404. In this manner, the encapsulant 406 serves as a spectral concentrator by converting a relatively wide range of energies of solar radiation into an energy band that is close to the bandgap energy of silicon, or another photoactive material forming the PV cells 404. During operation of the solar module 400, incident solar radiation passes through the substrate layer 408 and strikes the encapsulant 406, which absorbs this solar radiation and emits radiation in a substantially monochromatic energy band. In particular, the encapsulant 406 is configured to perform down-conversion with a bandgap energy $E_g$ close to a bandgap energy of the PV cells 404. Solar radiation with energies at or higher than the bandgap energy $E_g$ is absorbed and converted into emitted radiation with lower energies that match the bandgap energy of the PV cells 404. In this manner, thermalization can mostly occur within the encapsulant 406, rather than within the PV cells 404. Emitted radiation is directed towards the PV cells 404, and a certain fraction of the emitted radiation strikes either top surfaces 424 and 426 or bottom surfaces 428 and 430 of the PV cells 404, which absorb and convert this emitted radiation into electricity. A remaining fraction of the emitted radiation, which passes between the PV cells 404, strikes the Lambertian reflector 416, which reflects this emitted radiation. Reflected radiation is directed upwards and strikes the bottom surfaces 428 and 430 of the PV cells 404, which absorb and convert this reflected radiation into electricity. Reflected radiation that passes between the PV cells 404 is again reflected as a result of the bandstop reflector included in the ARC 412, and this reflected radiation can strike the top surfaces 424 and 426 of the PV cells 404 as described above. In the illustrated embodiment, the PV cells 404 are optimized to operate with respect to substantially monochromatic, emitted radiation.

Figure 5:
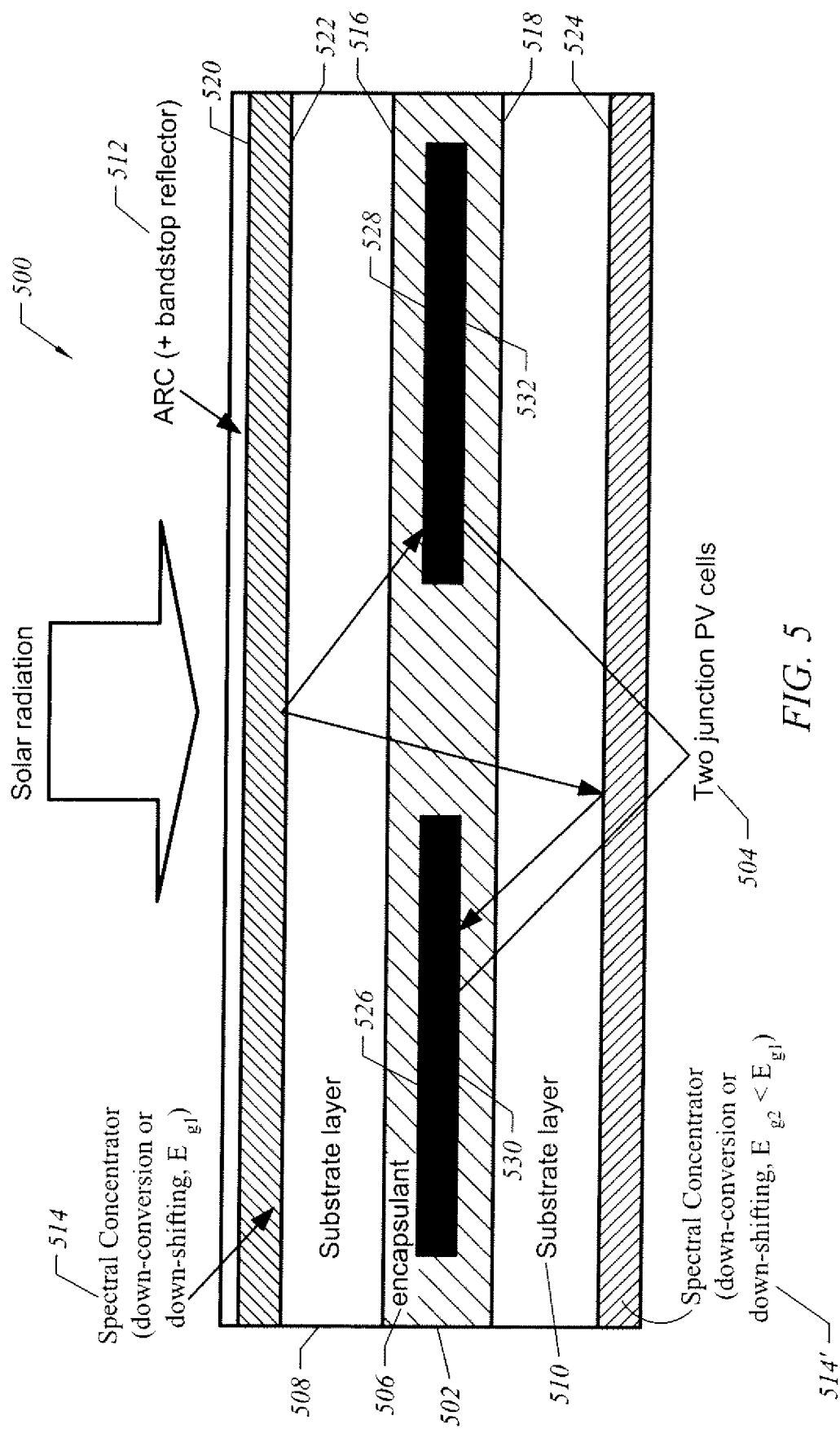
FIG. 5 illustrates a solar module implemented in accordance with a further embodiment of the invention.

FIG. 5 is a cross-sectional view of a portion of a solar module 500 implemented in accordance with a further embodiment of the invention. The solar module 500 includes an active layer 502, which includes a set of multi-junction PV cells 504 that are spaced apart from one another and are embedded within a suitable encapsulant 506. The multifunction PV cells 504 can be, for example, two-junction or tandem PV cells with two different bandgap energies. It is also contemplated that multiple single-junction PV cells with respective bandgap energies can be used. As illustrated in FIG. 5, the active layer 502 is sandwiched by a pair of substrate layers 508 and 510, which are adjacent to a top surface 516 and a bottom surface 518 of the active layer 502, respectively. An ARC 512, which includes a bandstop reflector, is formed adjacent to a top surface 520 of a spectral concentrator 514, which is further described below. The ARC 512 along with the bandstop reflector operate to reduce reflection of incident solar radiation and to inhibit escape of emitted radiation from the solar module 500. Certain aspects of the solar module 500 can be implemented in a similar manner as described above for the solar module 100, and, therefore, are not further described herein.

As illustrated in FIG. 5, the solar module 500 also includes a pair of spectral concentrators, namely the spectral concentrator 514 and a spectral concentrator 514'. The spectral concentrator 514 is formed as a set of coatings, films, or layers adjacent to a top surface 522 of the substrate layer 508, and the spectral concentrator 514' is formed as a set of coatings, films, or layers adjacent to a bottom surface 524 of the substrate layer 510. During operation of the solar module 500, incident solar radiation strikes the spectral concentrator 514, which absorbs a certain fraction of this solar radiation and emits radiation in a substantially monochromatic energy band. In particular, the spectral concentrator 514 is configured to perform down-conversion with a bandgap energy $E_{g1}$ close to a first bandgap energy of the PV cells 504. Solar radiation with energies at or higher than the bandgap energy $E_{g1}$ is absorbed and converted into emitted radiation with lower energies that match the first bandgap energy of the PV cells 504. Solar radiation with energies lower than the bandgap energy $E_{g1}$ is not absorbed by the spectral concentrator 514 and passes through the spectral concentrator 514. Emitted radiation from the spectral concentrator 514 is directed downwards, and the emitted radiation strikes top surfaces 526 and 528 of the PV cells 504, which absorb and convert this emitted radiation into electricity. A remaining fraction of the lower energy, incident solar radiation, which passes between the PV cells 504 and through the substrate layer 510, strikes the spectral concentrator 514', which absorbs this solar radiation and emits radiation in a substantially monochromatic energy band. In particular, the spectral concentrator 514' is configured to perform down-conversion with a bandgap energy $E_{g2}$ close to a second bandgap energy of the PV cells 504. In the illustrated embodiment, the bandgap energy $E_{g2}$ is smaller than the bandgap energy $E_{g1}$, and solar radiation with energies at or higher than the bandgap energy $E_{g2}$ are absorbed and converted by the spectral concentrator 514' into emitted radiation with lower energies that match the second bandgap energy of the PV cells 504. Emitted radiation from the spectral concentrator 514, is directed upwards, and the emitted radiation strikes bottom surfaces 530 and 532 of the PV cells 504, which absorb and convert this emitted radiation into electricity. In this manner, thermalization can mostly occur within the spectral concentrators 514 and 514', rather than within the PV cells 504. Emitted radiation that passes between the PV cells 504 is reflected as a result of the bandstop reflector included in the ARC 512, and this reflected radiation can strike the top surfaces 526 and 528 of the PV cells 504 as described above. In the illustrated embodiment, the PV cells 504 are optimized to operate with respect to substantially monochromatic, emitted radiation.

Luminescent Materials

A variety of luminescent materials can be used to form the solar modules described herein. Examples include organic fluorophors, inorganic fluorophors and phosphors, nanoparticles, and semiconductor materials.

Inorganic fluorophors having optical transitions in the range of about 900 nm to about 980 nm can be suitable for use with PV cells based on silicon. An inorganic fluorophor having a suitable emission wavelength can be selected based on an atomic moiety involved. For example, inorganic fluorophors with luminescence derived from transition or rare earth atoms can be used. Other examples of inorganic fluorophors include oxides (or other chalcoginides) with luminescence derived from a defect state in a crystal.

Nanoparticles, such as nanoparticles formed from silicon or germanium, can be useful for spectral concentration. The nanoparticles can be formed as self-assembled nanoparticles, such as by vacuum deposition, or as discrete nanoparticles, such as in a colloidal solution. The nanoparticles can be formed with a high quantum efficiency for photoluminescence by reducing defect density, typically to less than one defect per nanoparticle. In addition, surfaces of the nanoparticles can be suitably terminated to enhance the photoluminescence. Emission wavelength of the nanoparticles can be dependent upon, or controlled by, their sizes. A narrow distribution of sizes can be desirable, so that a resulting spectral width is narrow, and there is reduced self-absorption of emitted light from smaller-sized nanoparticles by larger-sized nanoparticles.

Semiconductor materials, such as indium phosphide or InP, with a bandgap energy that is near and slightly above the bandgap energy of PV cells can also be used. In particular, semiconductor materials with a bandgap energy in the range of about 1.1 eV to about 1.5 eV, such as from about 1.2 eV to about 1.4 eV, at 300K can be suitable as spectral concentrators for PV cells based on silicon.

For example, indium phosphide has a direct, allowed handgap energy of about 1.35 eV and an absorption coefficient of about $10^5$ cm$^{-1}$. Indium phosphide can be deposited by a variety of processes, such as sputter deposition, Metalorganic Chemical Vapor Deposition ("MOCVD"), Organometallic Chemical Vapor Deposition ("OMCVD"), atmospheric chemical vapor deposition, Atomic Layer Deposition ("ALD"), Molecular Beam Epitaxy ("MBE") deposition, and so forth. Indium phosphide, or another semiconductor material, can be deposited in a single layer or in multiple layers that are optionally interspersed with other layers. The other layers can be included for optical and efficiency purposes and for chemical and environmental protection, such as silica and alumina as hermetic sealants. The absorption coefficient of indium phosphide, or another semiconductor material, in the optical wavelengths of the solar spectrum can be in the range of about $10^4$ cm$^{-1}$ or greater at energies larger than the bandgap edge. A film thickness in the micrometer range, such as a few micrometers or less, can have an optical density of 2 or more to allow at least about 99 percent of incident solar radiation to be absorbed. Indium phosphide, or another semiconductor material, can also be deposited into porous matrices or deposited as nanoparticles. For example, indium phosphide can be formed as nanoparticles and dispersed in a matrix such as an optically stable polymer or an inorganic glass. The total amount of absorbing semiconductor material can be equivalent to an optical density of 2 or more to allow at least about 99 percent of incident solar radiation to be absorbed. Use of a resonant cavity structure allows the efficient use of semiconductor materials in the form of thin films. Furthermore, the resonant cavity structure, by modification of a radiation matrix, allows the use of semiconductor materials with forbidden optical transitions and indirect optical transitions in the desired wavelength range for spectral concentration. Lower bandgap energy materials can also be made to luminescent by quantum confinement, either in thin films or by formation of nanoparticles.

A class of luminescent materials is disclosed in co-pending and co-owned U.S. patent application Ser. No. 11/689,381, (US Publication No. 2008/0014463 A1), entitled "Luminescent Materials that Emit Light in the Visible Range or the Near Infrared Range" and filed on Mar. 21, 2007, the disclosure of which is incorporated herein by reference in its entirety. This class of luminescent materials includes semiconductor materials that can be represented with reference to the formula:

$$[A_a B_b X_x][\text{dopants}] \qquad (1)$$

In formula (I), A is selected from elements of Group IA, such as sodium (e.g., as Na(I) or Na$^{1+}$), potassium (e.g., as K(I) or K$^{1+}$), rubidium (e.g., as Rb(I) or Rb$^{1+}$), and cesium (e.g., as Cs(I) or Cs$^{1+}$); B is selected from elements of Group VA, such as vanadium (e.g., as V(III) or V$^{+3}$), elements of Group IB, such as copper (e.g., as Cu(I) or Cu$^{+1}$), silver (e.g., as Ag(I) or Ag$^{+1}$), and gold (e.g., as Au(I) or Au$^{+1}$), elements of Group IIB, such as zinc (e.g., as Zn(II) or Zn$^{+2}$), cadmium (e.g., as Cd(II) or Cd$^{+2}$), and mercury (e.g., as Hg(II) or Hg$^{+2}$), elements of Group IIIB, such as gallium (e.g., as Ga(I) or Ga$^{+1}$), indium (e.g., as In(I) or In$^{+1}$), and thallium (e.g., as Tl(I) or Tl$^{+1}$), elements of Group IVB, such as germanium (e.g., as Ge(II) or Ge$^{+2}$ or as Ge(IV) or Ge$^{+4}$), tin (e.g., as Sn(II) or Sn$^{+2}$ or as Sn(IV) or Sn$^{+4}$), and lead (e.g., as Pb(II) or Pb$^{+2}$ or as Pb(IV) or Pb$^{+4}$), and elements of Group VB, such as bismuth (e.g., as Bi(III) or Bi$^{+3}$); and X is selected from elements of Group VIIB, such as fluorine (e.g., as F$^{-1}$), chlorine (e.g., as Cl$^{-1}$), bromine (e.g., as Br$^{-1}$), and iodine (e.g., as I$^{-1}$). Still referring to formula (I), a is an integer that can be in the range of 1 to 9, such as from 1 to 5; b) is an integer that can be in the range of 1 to 5, such as from 1 to 3; and x is an integer that can be in the range of 1 to 9, such as from 1 to 5. In some instances, a can be equal to 1, and x can be equal to 1+2b. It is also contemplated that one or more of a, b, and x can have fractional values within their respective ranges. It is further contemplated that $X_x$ in formula (I) can be more generally represented as $X_x X'_{x'} X''_{x''}$, where X, X'', and X'' can be independently selected from elements of Group VIIB, and the sum of x, x', and x'' can be in the range of 1 to 9, such as from 1 to 5. With reference to the generalized version of formula (I), a can be equal to 1, and the sum of x, x', and x'' can be equal to 1+2b. Dopants included in a luminescent material represented by formula (I) can be present in amounts that are less than about 5 percent, such as less than about 1 percent, in terms of elemental composition, and can derive from ingredients that are used to form the luminescent material. In particular, the dopants can include cations and anions, which form electron acceptor/electron donor pairs that are dispersed within a microstructure of the luminescent material.

Several luminescent materials represented by formula (I) have characteristics that are desirable for spectral concentration. In particular, the luminescent materials can exhibit photoluminescence with a high quantum efficiency that is greater than about 6 percent, such as at least about 10 percent, at least about 20 percent, at least about 30 percent, at least about 40 percent, or at least about 50 percent, and can be up to about 90 percent or more, Also, the luminescent materials can exhibit photoluminescence with a narrow spectral width that is no greater than about 120 nm at FWHM, such as no greater than about 100 nm or no greater than about 80 nm at FWHM. Thus, for example, the spectral width can be in the range of about 20 nm to about 120 nm at FWHM such as from about 50 nm to about 120 nm, from about 20 nm to about 100 nm, from about 50 nm to about 100 nm, from about 50 nm to about 80 nm, or from about 20 nm to about 80 nm n at FWHM.

In addition, the luminescent materials can have bandgap energies that are tunable to desirable levels by adjusting ingredients and processing conditions that are used. For example, a bandgap energy can correlate with A, with the order of increasing bandgap energy corresponding to, for example, cesium, rubidium, potassium, and sodium. As another example, the bandgap energy can correlate with X, with the order of increasing bandgap energy corresponding to, for example, iodine, bromine, chlorine, and fluorine, this order of increasing bandgap energy can translate into an order of decreasing peak emission wavelength. Thus, for example, a luminescent material including iodine can sometimes exhibit a peak emission wavelength in the range of about 900 nm to about 1 μm, while a luminescent material including bromine or chlorine can sometimes exhibit a peak emission wavelength in the range of about 700 nm to about 800 nm. By tuning bandgap energies, the resulting photoluminescence can have a peak emission wavelength located within a desirable range of wavelengths, such as the visible range or the infrared range. In some instances, the peak emission wavelength can be located in the near infrared range, such as from about 900 nm to about 1 μm, from about 910 nm to about 1 μm, from about 910 nm to about 980 nm, or from about 930 nm to about 980 nm.

Moreover, the photoluminescent characteristics described above can be relatively insensitive over a wide range of excitation wavelengths. Indeed, this unusual characteristic can be appreciated with reference to excitation spectra of the luminescent materials, which excitation spectra can be substantially flat over a range of excitation wavelengths encompassing portions of the ultraviolet range, the visible range, and the infrared range. In some instances, the excitation spectra can be substantially flat over a range of excitation wavelengths from about 200 nm to about 1 μm, such as from about 200 nm n to about 980 nm or from about 200 nm to about 950 nm. Similarly, absorption spectra of the luminescent materials can be substantially flat over a range of excitation wavelengths encompassing portions of the ultraviolet range, the visible range, and the infrared range. In some instances, the absorption spectra can be substantially flat over a range of excitation wavelengths from about 200 nm to about 1 μm, such as from about 200 nm to about 980 nm or from about 200 nm to about 950 nm.

According to some embodiments of the invention, one method to form a luminescent material involves a conversion of a set of ingredients into the luminescent material at high yields and at moderate temperatures and pressures. The method can be represented with reference to the formula:

$$\text{Source}(B) + \text{Source}(A,X) \rightarrow \text{Luminescent Material} \quad (1)$$

In formula (1), source(B) serves as a source of B, and, in some instances, source(B) can also serve as a source of dopants. B can be selected from elements having suitable oxidation states, such that their ground electronic states include filled s orbitals and can be represented as $(ns)^2$.

In the case that B is tin, for example, source(B) can include one or more types of tin-containing compounds selected from tin(II) compounds of the form $BY$, $BY_2$, $B_3Y_2$, and $B_2Y$ and tin (IV) compounds of the form $BY_4$, where Y can be selected from elements of Group VIB, such as oxygen (e.g., as $O^{-2}$); elements of Group VIIB, such as fluorine (e.g., as $F^{-1}$), chlorine (e.g., as $Cl^{-1}$), bromine (e.g., as $Br^{-1}$), and iodine (e.g., as $I^{-1}$); and poly-elemental chemical entities, such as nitrate (i.e., $NO_3^{-1}$), thiocyanate (i.e., $SCN^{-1}$), hypochlorite (i.e., $OCl^{-1}$), sulfate (i.e., $SO_4^{-2}$), orthophosphate (i.e., $PO_4^{-3}$), metaphosphate (i.e., $PO_3^{-1}$), oxalate (i.e., $C_2O_4^{-2}$), methanesulfonate (i.e., $CH_3SO_3^{-1}$), trifluoromethanesulfonate (i.e., $CF_3SO_3^{-1}$), and pyrophosphate (i.e., $P_2O_7^{-4}$). Examples of tin(II) compounds include tin(II) fluoride (i.e., $SnF_2$), tin(II) chloride (i.e., $SnCl_2$), tin(II) chloride dihydrate (i.e., $SnCl_2.2H_2O$), tin(II) bromide (i.e., $SnBr_2$), tin(II) iodide (i.e., $SnI_2$), tin(II) oxide (i.e., $SnO$), tin(II) sulfate (i.e., $SnSO_4$), tin(II) orthophosphate (i.e., $Sn_3(PO_4)_2$), tin(II) metaphosphate (i.e., $Sn(PO_3)_2$), tin(II) oxalate (i.e., $Sn(C_2O_4)$), tin(II) methanesulfonate (i.e., $Sn(CH_3SO_3)_2$), tin(II) pyrophosphate (i.e., $Sn_2P_2O_7$), and tin(II) trifluoromethanesulfonate (i.e., $Sn(CF_3SO_3)_2$). Examples of tin (IV) compounds include tin (IV) chloride (i.e., $SnCl_4$) and tin(IV) chloride pentahydrate (i.e., $SnCl_4.5H_2O$).

In formula (1), source(A, X) serves as a source of A and X, and, in some instances, source(A, X) can also serve as a source of dopants. Examples of source(A, X) include alkali halides of the form AX. In the case that A is cesium, for example, source(A, X) can include one or more types of cesium(I) halides, such as cesium(I) fluoride (i.e., CsF), cesium(I) chloride (i.e., CsCl), cesium(I) bromide (i.e., CsBr), and cesium(I) iodide (i.e., CsI). It is contemplated that different types of source(A, X) can be used (e.g., as source(A, X), source(A, X'), and source(A, X") with X, X', and X" independently selected from elements of Group VIIB) to form a resulting luminescent material having mixed halides.

The method represented by formula (1) can be performed by mixing source(B) and source(A, X) in a dry form, in solution, or in accordance with any other suitable mixing technique. For example, source(B) and source(A, X) can be provided in a powdered form, and can be mixed using a mortar and a pestle. As another example, source(B) and source(A, X) can be dispersed in a reaction medium to form a reaction mixture. The reaction medium can include a solvent or a mixture of solvents, which can be selected from a variety of standard solvents, such as alcohols (e.g., methanol, ethanol, isopropyl alcohol, butanol, and ethylene glycol), alkanes (e.g., hexane, heptane, decane, docosane, and octadecane), arenes (e.g., benzene, chlorobenzene, dichlorobenzene, naphthalene, tetralin, toluene, xylene, and mesitylene), amines (e.g., triethylamine), ethers (e.g., glyme, diglyme, triglyme, and tetrahydrofuran), amides (e.g., dimethylformamide), ketones (e.g., acetone and N-methylpyrrolidone), sulfoxides (e.g., dimethylsulfoxide), and water. The reaction medium can also include one or more of the following ingredients: a dispersant (e.g., a coupling agent), a wetting agent (e.g., a surfactant, such as sodium dodecyl sulfate, a polymeric surfactant, or any other suitable ionic or non-ionic surfactant), a polymer binder (or other vehicle), an anti-foaming agent, a preservative, a stabilizer, and a pH adjusting agent. It is also contemplated that a suitable deposition technique can be used in place of, or in conjunction with, a mixing technique. For example, source(B) and source(A, X) can be subjected to electron-beam deposition, sputter deposition, pulsed laser deposition, vacuum deposition, or vapor deposition to form a film, which can be annealed to form the luminescent material. In particular, source(B) and source(A, X) can be co-evaporated (e.g., co-vaporized) and co-deposited on a substrate to form a film, or can be sequentially evaporated (e.g., vaporized) and deposited to form adjacent films.

In some instances, the conversion of source(B) and source (A, X) into the luminescent material can be facilitated by applying a form of energy, such as acoustic or vibrational energy, electrical energy, magnetic energy, mechanical energy, optical energy, or thermal energy. It is also contemplated that multiple forms of energy can be applied simultaneously or sequentially. For example, source(B) and source (A, X) can be mixed in a dry form, and the resulting mixture can be pressed to a pressure in the range of about $1\times10^5$ Pascal to about $7\times10^8$ Pascal, such as using a standard pellet press or a standard steel die, to form the luminescent material in a pellet form. As another example, source(B) and source(A, X) can be mixed in a dry form, and the resulting mixture can be heated to a temperature in the range of about 50° C. to about 650° C., such as from about 80° C. to about 350° C. or from about 80° C. to about 300° C., to form the luminescent material. If desired, heating can be performed in an inert atmosphere (e.g., a nitrogen atmosphere) or a reducing atmosphere for a time period in the range of about 0.5 hour to about 9 hours.

The resulting luminescent material can include A, B, and X as major elemental components as well as elemental components derived from or corresponding to Y. In particular, B can be present in an amount that is greater than a typical doping level, such as at least about 1 percent or at least about 5 percent in terms of elemental composition. Also, the luminescent material can include additional elemental components, such as carbon, chlorine, hydrogen, and oxygen, that can be present in amounts that are less than about 5 percent in terms of elemental composition, and further elemental components, such as sodium, sulfur, phosphorus, and potassium, that can be present in trace amounts that are less than about 0.1 percent in terms of elemental composition.

In the case that A is cesium, B is tin, and X is iodine, for example, the luminescent material can sometimes be represented with reference to one of the formulas:

$$[CsSnI_3][dopants] \qquad (2)$$

$$[CsSn_2I_5][dopants] \qquad (3)$$

$$[CsSn_3I_7][dopants] \qquad (4)$$

In the case of formula (2), for example, the resulting luminescent material can have a perovskite-based microstructure that is layered with relatively strong chemical bonding along a particular layer but relatively weak chemical bonding between different layers. This perovskite-based microstructure can undergo transitions between a variety of phases that have different colors. The luminescent material of formula (2) can be a semiconductor having a resistivity and a band gap energy that can be tuned to desirable levels by adjusting ingredients and processing conditions that are used. For example, the resistivity can be varied by a factor of 100 or more with respect to a typical value of about 100 μΩ·cm. Similarly, the band gap energy can be varied from about 1.2 eV to about 2.3 eV, and can correlate with a color of the luminescent material, with the order of increasing band gap energy corresponding to, for example, black, orange, and yellow.

In the case that A is cesium, B is indium, and X is iodine, for example, the luminescent material can sometimes be represented with reference to the formula:

$$[CsInI][dopants] \qquad (5)$$

In the case that A is cesium, B is germanium, and X is iodine, for example, the luminescent material can sometimes be represented with reference to the formula:

$$[CsGeI_3][dopants] \qquad (6)$$

In the case that A is rubidium, B is tin, and X is iodine, for example, the luminescent material can sometimes be represented with reference to the formula:

$$[RbSnI_3][dopants] \qquad (7)$$

n the case that A is potassium, B is tin, and X is iodine, for example, the luminescent material can sometimes be represented with reference to the formula:

$$[KSnI_3][dopants] \qquad (8)$$

In the case that A is cesium, B is indium, and X is bromine, for example, the luminescent material can sometimes be represented with reference to the formula:

$$[CsInBr][dopants] \qquad (9)$$

In the case that A is cesium, B is tin, and X is bromine, for example, the luminescent material can sometimes be represented with reference to the formula:

$$[CsSnBr_3][dopants] \qquad (10)$$

In the case that A is cesium, B is tin, X is chlorine, and X' is iodine, for example, the luminescent material can sometimes be represented with reference to one of the formulas:

$$[CsSnClI_2][dopants] \qquad (11)$$

$$[CsSn_2Cl_2I_3][dopants] \qquad (12)$$

In the case that A is cesium, B is tin, X is bromine, and X' is iodine, for example, the luminescent material can sometimes be represented with reference to the formula:

$$[CsSnBr_2I][dopants] \qquad (13)$$

Two semiconductor materials with desirable characteristics are designated as UD-700 and UD-930. The composition of these materials is represented as $CsSn_bX_{1+2b}$. In the case of UD-700, X is bromine, and, in the case of UD-930, X is iodine. The spectral width of UD-700 and UD-930 is narrow (e.g., about 50 meV or less at FWIM), and the absorption spectrum is substantially flat from the absorption edge into the far ultraviolet. Photoluminescent emission of UD-700 and UD-9930 is stimulated by a wide range of wavelengths of solar radiation up to the absorption edge of these materials at about 700 nm for UD-700 and about 950 nm for UD-930.

Figure 6:
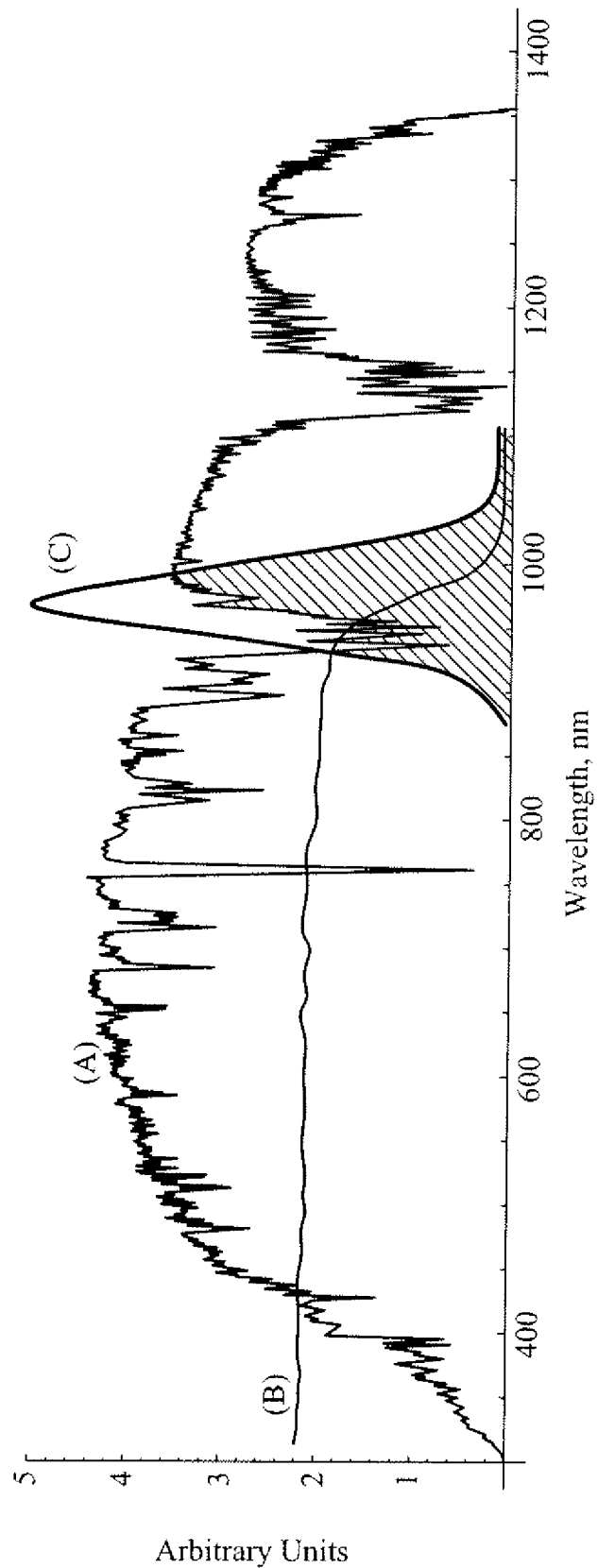
FIG. 6 illustrates a combined representation of an incident solar spectrum and measured absorption and emission spectra of UD-930 in accordance with an embodiment of the invention.

Desirable characteristics of UD-930 can be further appreciated with reference to FIG. 6, which illustrates a combined representation of a solar spectrum and measured absorption and emission spectra of UD-930 in accordance with an embodiment of the invention. In particular, FIG. 6 illustrates the AM1.5G solar spectrums (referenced as (A)), which is a standard solar spectrum representing incident solar radiation on the surface of the earth. The AM1.5G solar spectrum has a gap in the region of 930 nm due to atmospheric absorption. In view of the AM1.5G solar spectrum and characteristics of PV cells based on silicon, the absorption spectrum (referenced as (B)) and emission spectrum (referenced as (C)) of UD-930 render this material particularly effective for spectral concentration when incorporated within a luminescent layer. In particular, photoluminescence of UD-930 is substantially located in the gap of the AM1.5G solar spectrum, with the peak emission wavelength of about 950 nm falling within the gap. This, in turn, allows the use of a bandstop reflector that is tuned to reflect emitted radiation back towards the luminescent layer, without significant reduction of incident solar radiation that can pass through the bandstop reflector and reach the luminescent layer. Also, the absorption spectrum of UD-930 is substantially flat and extends from the absorption edge at about 950 nm through substantially the full AM1.5G solar spectrum into the ultraviolet. In addition, the peak emission wavelength of about 950 nm (or about 1.3 eV) is matched to the absorption edge of PV cells based on silicon, and the spectral width is about 50 meV at FWHM (or about 37 nm at FWHM). The absorption coefficient of silicon is about $10^2$ cm$^{-1}$ in this range of emission wavelengths, and junction regions within the PV cells can be designed to efficiently absorb the emitted radiation and convert the radiation into electron-hole pairs. As a result, UD-930 can broadly absorb a wide range of wavelengths from incident solar radiation, while emitting a narrow range of wavelengths that are matched to silicon to allow a high conversion efficiency of incident solar radiation into electricity. Furthermore, the absorption spectrum and the emission spectrum of UD-930 overlap to a low degree, thereby reducing instances of self-absorption that would otherwise lead to reduced conversion efficiency.

Other luminescent materials that are suitable as spectral concentrators include $Zn_3P_2$, $Cu_2O$, $CuO$, $CuInGaS$, $CuIn$-$GaSe$, and so forth. Table I below lists a variety of semiconductor materials that can be used to form the solar modules described herein.

TABLE I

Examples of Spectral Concentrator Materials

| material | $E_g$ (eV, 300K) | type |
|---|---|---|
| Ge QD | 0.8 to 1.5 | |
| Si QD | 1.2 to 1.5 | |
| InP | 1.34 | direct |
| $Ga_xIn_{1-x}As_yP_{1-y}$ | 1.2 to 1.4 | |
| CdTe | 1.475 | direct |
| $Ga_2Te_3$ | 1.2 | direct |
| $In_2Se_3$ | 1.3 | direct |
| InSe | 1.2 | indirect |
| $In_2Te_3$ | 1.1 | direct |
| InTe | 1.16 | direct |
| $CuGaTe_2$ | 1.2 | |
| $CuInS_2$ | 1.5 | |
| $Cu_3In_5Se_9$ | 1.1 | |
| $CuInS_{2-x}Se_x$ | 1.1 to 1.4 | direct |
| $Ag_3In_5Se_9$ | 1.22 | |
| $AgGaTe_2$ | 1.3 | direct |
| $AgInSe_2$ | 1.2 | direct |
| $CuTlS_2$ | 1.4 | |
| $Cr_2S_3$ | 1.1 | |
| $FeP_2$ | 0.4 | |
| $FeSi_2$ | 0.8 | |
| $Mg_2Si$ | 0.8 | |
| $MoS_2$ inte. | <1.4 | |
| $MoSe_2$ inte. | <1.2 | |
| $WS_2$ inte. | 1.1 | |
| $Sr_2CuO_2Cl$ | 1.3 | direct |
| $ZnGeP_2$ | 1.3 | direct |
| $Zn_3P_2$ | 1.35 | indirect |
| $Zn_3P_2$ | 1.4 | direct |
| $\beta\ ZnP_2$ | 1.3 | direct |
| $KTaO_3$ | 1.5 | |
| $BaSnO_3$ | 1.4 | |
| $CrCa_2GeO_4$ | 1.1 | |
| $LaMnO_3$ | 1.3 | |
| $Ba_{1-x}Sr_xSi_2$ | 1.2 | |
| $BaSi_2$ | 1.3 | direct |
| $ZnGeAs_2$ | 1.12 | direct |
| $CdSnP_2$ | 1.17 | direct |
| $Cu_3AsS_4$ | 1.24 | |
| $CdIn_2Te_4$ | 1.25 | direct |
| $Na_3Sb$ | 1.1 | |
| $K_3Sb$ | 1.1 | |
| CuO | 1.4 | indirect |
| $Cu_2O$ | 1.4 | forbidden, direct |
| $Cu_2S$ | 1.3 | direct |
| $Cu_2Se$ | 1.2 | direct |
| $Cd_4Sb_3$ | 1.4 | |
| TlS | 1.36 | direct |
| $BiS_3$ | 1.3 | |
| $BiI_3$ | 1.35 | |
| $NiP_2$ | 0.7 | |
| SnS | 1.1 | |
| SnSe | 0.9 | |
| $Ti_{1+x}S_2$ | 0.7 | |
| $TiS_{3-x}$ | 0.9 | |

TABLE I-continued

Examples of Spectral Concentrator Materials

| material | $E_g$ (eV, 300K) | type |
|---|---|---|
| $Zn_3N_2$ | 1.2 | |
| $Ag_8GeS_6$ | 1.39 | |
| $Ag_8SnS_6$ | 1.28 | |
| $CdInSe_2$ | 1.4 | |
| $HgTlS_2$ | 1.25 | |
| BiSeI | 1.3 | |
| $MgGa_2S_4$ | 1.2 | |

Absorption and emission characteristics are typically several orders of magnitude lower for semiconductor materials having indirect optical transitions or forbidden optical transitions, as compared with those materials having direct optical transitions. However, by modification of a radiation matrix, resonant cavity effects can enhance absorption and emission characteristics and allow the use of semiconductor materials having indirect or forbidden optical transitions. Referring to Table 1, CuO is an indirect bandgap semiconductor material having a bandgap energy of about 1.4 eV, and $Cu_2O$ has a direct but spin forbidden bandgap energy of about 1.4 eV. By incorporating within a resonant cavity structure, either, or both, CuO and $Cu_9O$ can be used for spectral concentration. Still referring to Table 1, $Zn_3P_2$ has an indirect optical transition of about 50 meV below a direct optical transition of about 1.4 eV. Resonant cavity effects can allow coupling of the indirect optical transition to the higher energy direct optical transition, thereby providing enhanced absorption and emission for use as spectral concentrators.

To reduce self-absorption of emitted light within a luminescent layer, luminescence can occur via exciton emission. An exciton corresponds to an electron-hole pair, which can be formed as a result of light absorption. A bound or free exciton can have a Stokes shift equal to an exciton binding energy. Many semiconductor materials have exciton binding energies of less than about 20 meV. Room temperature is about 25 meV, so excitons are typically not present at room temperature for these materials. Some semiconductor materials, such as CdTe and HgTe, have excitons with high binding energies and are present at room temperature. However, some of these semiconductor materials may be toxic or relatively expensive. Other semiconductor materials have intrinsic excitons at room temperature, such as bismuth triiodide or $BiI_3$, and can be desirable for the solar modules described herein.

Certain layered semiconductor materials, such as tin and lead halides, can have bandgap and exciton energies tuned by separation of inorganic layers with organic components. Examples include organic-inorganic quantum well materials, conducting layered organic-inorganic halides containing 110-oriented perovskite sheets, hybrid tin iodide perovskite semiconductor materials, and lead halide-based perovskite-type crystals. Certain aspects of these semiconductor materials are described in Ema et al., "Huge Exchange Energy and Fine Structure of Excitons in an Organic-Inorganic Quantum Well," Physical Review B, Vol. 73, pp. 241310-1 to 241310-4 (2006); Mitzi et al., "Conducting Layered Organic-inorganic Halides Containing 110-Oriented Perovskite Sheets," Science, Vol. 267, pp. 1473-1476 (1995); Kagan et al., "Organic-inorganic Hybrid Materials as Semiconducting Channels in Thin-Film Field-Effect Transistors," Science, Vol. 286, pp. 945-947 (1999); Mitzi, "Solution-processed Inorganic Semiconductors," J. Mater. Chem., Vol. 14, pp. 2355-2365 (2004); Symonds et al., "Emission of Hybrid Organic-inorganic Exciton Plasmon Mixed States," Applied Physics Letters, Vol. 90, 091107 (2007); Zoubi et al., "Polarization Mixing in Hybrid Organic-Inorganic Microcavities," Organic Electronics, Vol. 8, pp. 127-135 (2007); Knutson et al., "Tuning the Bandgap in Hybrid Tin Iodide Perovskite Semiconductors Using Structural Templating," Inorg. Chem., Vol. 44, pp. 4699-4705 (2005); and Tanaka et al., "Comparative Study on the Excitons in Lead-halide-based Perovskite-type crystals $CH_3NH_3PbBr_3$ $CH_3NH_3PbI_3$," Solid State Communications, Vol. 127, pp. 619-623 (2003), the disclosures of which are incorporated herein by reference in their entireties.

Also, other layered materials, such as tin sulfide, tin selenide, titanium sulfide, and others listed in Table I, can be tuned by intercalating other materials between the layered materials. ALD can be used to make layered materials with tuned bandgap energies and tuned exciton binding energies. Tuning an exciton to higher energy can reduce self-absorption and enhance the probability of lasing. Such material-process combination can be used to develop a low self-absorption luminescent material by tuned exciton luminescent emission. This can be further combined with a resonant cavity structure, in either a weak or strong coupling regime, to produce a low loss, high quantum efficiency, down-conversion structure. Thermal quenching, namely the reduction of luminescence intensity with an increase in temperature, can be reduced or eliminated by generating an exciton with a binding energy greater than the Boltzman temperature, which is about 25 meV at room temperature. For solar applications, a binding energy in the range of about 35 meV to about 50 meV can be desirable. A larger binding energy can lead to a Stokes shift in the photoluminescence from the absorption edge that results in an absorption gap, thereby leading to lower solar energy conversion efficiencies.

Another way to reduce self-absorption is via the use of orientated birefringence. In particular, one way to reduce self-absorption in a specific direction within a single crystal or film is to orient a birefringent material. Birefringence refers to a different refractive index along two or more different directions of a material. A birefringent material, such as a semiconductor material, has two or more different bandgap energies along different crystal axis. If a crystal anisotropy has a bandgap in the visible range of an optical spectrum, the material can be referred to as being dichoric rather than birefringent. Various birefringent semiconductor materials can be used as spectral concentrators, such as $CuInSe_{2-x}S_x$, $Zn_3N_2$, and perovskites such as $CsSn_{1+x}I_{3+2x}$. Since there are two or more absorption edges or bandgap energies for a birefringent material, a resulting film can be deposited in an oriented state with the higher bandgap energy (i.e., shorter wavelength absorption edge) along a direction facing towards PV cells. In this case, emitted light in the direction facing towards the PV cells can have a lower absorbance because the emission wavelength is longer than the higher energy bandgap. The use of resonant cavity effects and Bragg reflectors can suppress emission in other, more highly self-absorbed directions.

Thermal quenching and self-absorption can also be reduced by modifying material characteristics. For semiconductor materials, an absorption edge can become tilted with increasing temperature and certain types of doping. This absorption edge tilt can sometimes lead to increased self-absorption, and can be described by the Elliott equation. Proper doping and interface or surface modification can be used to control this absorption edge tilt to reduce instances of thermal quenching and self-absorption. In the case of nanoparticles formed from a semiconductor material, coatings formed on the nanoparticles can alter emission characteristics of the semiconductor material by the "Bragg Onion" technique.

The solar spectrum on the surface of the earth ranges from the ultraviolet into the infrared. Photons absorbed from the ultraviolet to about 1.3 eV are about 49.7 percent of the total number of photons and about 46.04 percent of the total energy. Of the absorbed photons at 100 percent quantum efficiency, a luminescent material with emission at about 1.3 eV can yield a solar energy conversion efficiency of about 46 percent (for one photon to one photon mechanism). Multiple photon generation can yield higher solar energy conversion efficiencies. Silicon nanoparticles, such as silicon quantum dots, that emit multiple photons can be used as spectral concentrators described herein to provide higher conversion efficiencies. Certain aspects of silicon nanoparticles are described in Beard et al., "Multiple Exciton Generation in Colloidal Silicon Nanocrystals," Nano Letters, published on the web on Jul. 24, 2007, the disclosure of which is incorporated herein by reference in its entirety.

Since about one half of incident solar radiation is at lower energy, or longer wavelength, than 1.3 eV (or 950 nm), conversion efficiency can be increased by up-conversion. Up-conversion can involve a process where two or more photons are absorbed and one photon is emitted at a higher energy. Rare earth atoms can be relatively efficient at undergoing up-conversion, and other processes, such as Second Harmonic Generation ("SHG") at relatively high intensities, can be used to enhance solar energy conversion efficiencies. The use of resonant cavity effects in a spectral concentrator can enhance up-conversion and non-linear processes such as SHG. Certain aspects of up-conversion are described in Sark et al., "Enhancing Solar Cell Efficiency by Using Spectral Converters," Solar Energy Materials & Solar Cells, Vol. 87, pp. 395-409 (2005); and Shalav et al., "Luminescent Layers for Enhanced Silicon Solar Cell Performance. Up-conversion," Solar Energy Materials & Solar Cells, Vol. 91, pp. 829-842 (2007), the disclosures of which are incorporated herein by reference in their entireties.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation and Characterization of Luminescent Material

Luminescent materials were prepared using a vacuum deposition system. The luminescent materials were formed as films on substrates, such as 25 mm square borosilicate glass slides. In particular, reagent grade $SnCl_2$ was placed in a first bell jar thermal evaporator boat, and reagent grade CsI was placed in a second thermal evaporator boat. Both evaporator boats were formed of tungsten. The system was evacuated to a pressure of less than $1 \times 10^{-5}$ torr. The thermal evaporator boat containing $SnCl_2$ was electrically heated to yield a deposition rate of $SnCl_2$ in the range of 0.1 nm/sec to 10 nm/sec, such as 1 nm/sec. The deposition of the $SnCl_2$-containing layer was continued to a thickness in the range of 100 nm to 1,500 nm, such as 300 nm. After the desired thickness was obtained, the electrical current to the thermal evaporator boat containing $SnCl_2$ was turned off, and electrical current was applied to the thermal evaporator boat containing CsI. CsI has a lower vapor pressure than $SnCl_2$, and, accordingly, a greater amount of electrical current was applied to yield a deposition rate of CsI in the range of 0.1 nm/sec to 10 nm/sec, such as 1 nm/sec. The thickness of the CsI-containing layer was in the range of 100 nm to 1,500 nm, such as 300 nm. The thickness ratio of $SnCl_2$ to CsI was varied in the range of 0.1 to 10. After the deposition of the layers of $SnCl_2$ and CsI was complete, the system was vented to atmospheric conditions. The resulting materials were observed to emit light in the range of 900 nm to 1 µm, such as with a peak emission wavelength of about 930 nm or about 950 nm. In some cases, the intensity of emitted light was enhanced by annealing, such as by heating in a nitrogen purged oven for 2 minutes to 1 hour at a temperature in the range of 120° C. to 350° C. A typical annealing process involved a ramp rate of 30° C./min to 210° C. for 10 minutes and a cool down at a ramp rate of 20° C./min.

Example 2

Formation and Characterization of Luminescent Material

A luminescent material was prepared using a vacuum deposition system. Reagent grade $SnBr_2$ was placed in a first bell jar thermal evaporator boat, and reagent grade CsBr was placed in a second thermal evaporator boat. Processing conditions were similar to those described in Example 1. The resulting material was observed to emit light in the range of 700 nm to 800 nm, such as with a peak emission wavelength of about 700 nm.

Example 3

Formation and Characterization of Luminescent Material

Luminescent materials were prepared using a vacuum deposition system. Reagent grade $SnBr_2$ was placed in a first bell jar thermal evaporator boat, and reagent grade CsI was placed in a second thermal evaporator boat. $SnBr_2$ and CsI were then sequentially evaporated and deposited on a substrate. The deposited layers of $SnBr_2$ and CsI were subjected to annealing for less than 20 minutes at a temperature of less than 200° C. The resulting materials were observed to emit light with a peak emission wavelength of about 700 nm. Higher annealing temperatures and longer annealing times were observed to yield materials with a peak emission wavelength of about 930 nm.

Example 4

Formation of Luminescent Material

A luminescent material was prepared using a vacuum deposition system. Reagent grade $SnCl_2$ and reagent grade CsI were mixed, and then placed in a single bell jar thermal evaporator boat. The mixture of $SnCl_2$ and CsI was then co-evaporated and co-deposited on a substrate to yield the luminescent material.

Example 5

Formation of Luminescent Material

A luminescent material was prepared using a vacuum deposition system. Reagent grade $SnCl_2$ and reagent grade CsI were mixed, and then pre-melted at a temperature greater than 210° C. The pre-melted mixture was evaporated and deposited on a substrate to yield the luminescent material.

Example 6

Formation and Characterization of Luminescent Material

A luminescent material was prepared by evaporating and depositing $SnCl_2$ and CsI. The deposition of $SnCl_2$ and CsI was carried out with a flow of $O_2$ gas. The flow rate of $O_2$ gas was varied from 10 standard cubic centimeters per minute ("sccm") to 200 sccm. The use of $O_2$ gas during deposition was observed to enhance the intensity and stability of the resulting photoluminescence.

Example 7

Formation and Characterization of Luminescent Material

Luminescent materials were prepared by evaporating and depositing $SnCl_2$ and CsI. The deposition of $SnCl_2$ and the CsI was carried out with a flow of $O_2$ gas, and then a layer of tin metal was deposited with the flow of $O_2$ gas continuing. The thickness of the tin metal-containing layer was in the range of 10 nm to 250 nm. The deposited layers were then annealed in a nitrogen atmosphere at a temperature in the range of 150° to 300° for 2 minutes to 1 hour. The initially metallic film became transparent or semi-transparent with various colors ranging from gold to blue to silver. The tin metal deposition was observed to enhance the intensity and stability of the resulting photoluminescence. Other materials can be deposited in place of, or in conjunction with, the tin metal, such as $TiO_2$, $SnO_2$, $Ta_2O_5$, $BaTiO_3$, Pd, Ag, Au, Cu, Sn, SiN, $SiO_xN_y$, MgO, BaSi, semiconductors, polymers, and materials used for coating and encapsulation.

Example 8

Formation of Luminescent Material

A luminescent material was prepared by evaporating and depositing $SnCl_2$ and CsI. The deposition of $SnCl_2$ and the CsI was carried out without a flow of $O_2$ gas, and then a layer of tin metal was deposited with a flow of $O_2$ gas.

Example 9

Formation of Luminescent Material

Luminescent materials were prepared using a vacuum deposition system including a thermal evaporator boat (tungsten with or without $Al_2O_3$ overcoat) and an electron-beam evaporator boat (graphite crucible). Reagent grade $SnCl_2$ (0.25 g to 2.5 g) was placed in the thermal evaporator boat, and reagent grade CsI (0.25 g to 2.5 g) was placed in the graphite crucible for electron-beam deposition. The mass ratio of $SnCl_2$ and CsI was varied in the range of 0.1 to 10. $SnCl_2$ was used as a powder or a pre-melt. The pre-melt was prepared by processing $SnCl_2$ powder at a temperature in the range of 240° C. to 260° C. for 10 minutes in a nitrogen atmosphere. CsI was used as a powder or as 1 $cm^2$ pellets. The pellets were prepared with a pressure in the range of $2 \times 10^8$ Pa to $3 \times 10^8$ Pa using a hydraulic press. The system was evacuated to a pressure between $5 \times 10^{-6}$ torr to $5 \times 10^{-4}$ torr, such as less than $2\times10^{-5}$ torr. Thermal evaporation was first carried out using an electrical current in the range of 5 A to 6 A, such as 5.5 A. Next, electron-beam deposition was carried out using an electrical current in the range of 0.5 mA to 10 mA, such as 1 mA. A high voltage setting for electron-beam deposition was in the range of 4.5 kV to 5.5 kV, such as 5.25 kV. Electron-beam sweep control was also used. A resulting rate of deposition was 0.2 nm/sec to 2 nm/sec for $SnCl_2$ and 0.5 nm/sec to 3 nm/sec for CsI. When the deposition was complete, the system was vented with air or nitrogen, and the resulting materials were left inside the system for another 10 minutes to 15 minutes. A total thickness of 500 nm to 2,000 nm was measured using a profiling system.

Example 10

Formation of Luminescent Material

Luminescent materials were prepared using a vacuum deposition system. The thickness of a $SnCl_2$-containing layer was in the range of 20 nm to 1,000 nm, and the thickness of a CsI-containing layer was in the range of 50 nm to 1,000 nm. The thickness ratio of $SnCl_2$ to CsI was varied in the range of 0.02 to 20. Processing conditions were similar to those described in Example 9.

Example 11

Formation of Luminescent Material

Processing conditions similar to those described in Example 9 were used to form layers of $SnCl_2$ and CsI. Next, $Al_2O_3$ powder was placed in a graphite crucible, and then pre-melted using an electron-beam sweep with an electrical current in the range of 35 mA to 45 mA. This process was carried out for 10 minutes to 15 minutes. Then, an $Al_2O_3$ overcoat was deposited on the layers of $SnCl_2$ and CsI using electron-beam deposition. The electron-beam deposition was carried out with an electrical current in the range of 30 mA to 40 mA and a high voltage setting of 5.25 kV, which produced a deposition rate of 0.05 nm/sec to 0.15 nm/sec. A total thickness of 50 nm to 200 nm was obtained. The $Al_2O_3$ overcoat serves to enhance the intensity and stability of the resulting photoluminescence.

Example 12

Formation of Luminescent Material

Processing conditions similar to those described in Example 9 were used to form layers of $SnCl_2$ and CsI. Next, $SiO_2$ crystalline chunks were placed in a graphite crucible, and $SiO_2$ was then deposited using electron-beam deposition. The electron-beam deposition was carried out with an electrical current in the range of 8 mA to 12 mA and a high voltage setting of 5.25 kV, which produced a deposition rate of 0.5 nm/sec to 0.8 nm/sec. A total thickness of 50 nm to 200 nm was obtained. The $SiO_2$ overcoat serves to enhance the intensity and stability of the resulting photoluminescence. Other materials can be deposited in place of, or in conjunction with, $SiO_2$, such as $TiO_2$, $SnO_2$, $Ta_2O_5$, $BaTiO_3$, Pd, Ag, Au, Cu, Sn, SiN, $SiO_iN_j$, MgO, BaSi, semiconductors, polymers, and materials used for coating and encapsulation.

Example 13

Formation of Luminescent Material

Processing conditions similar to those described in Example 9 are used, but with the order of deposition of $SnCl_2$ and CsI reversed.

Example 14

Formation of Luminescent Material

Processing conditions similar to those described in Example 9 are used, but with multiple deposited layers of $SnCl_2$, multiple deposited layers of CsI, or both. A typical time period between depositing each layer is from 1 minute to 2 minutes.

Example 15

Formation of Luminescent Material

Processing conditions similar to those described in Example 9 are used, but with $SnCl_2$ and CsI being co-deposited. A typical time period between depositing each layer is from 1 minute to 2 minutes.

Example 16

Formation of Luminescent Material

Processing conditions similar to those described in Example 9 are used. After the deposition of $SnCl_2$ and CsI is complete, the resulting material is subjected to annealing by heating in a nitrogen purged oven for 5 minutes to 2 hours at a temperature in the range of 150° C. to 350° C. A typical annealing process involves a ramp rate of 5° C./min to 50° C./min.

Example 17

Formation of Luminescent Material

Luminescent materials are formed on various substrates using processing conditions similar to those described in Example 9. Examples of the substrates include silicon wafers, germanium wafers, GaAs wafers, and substrates formed of borosilicate glass, micro-roughened glass, silica, polycrystalline $Al_2O_3$, MgO, SrTiO, indium tin oxide ("ITO"), sapphire, and $LiF_2$. The substrates have dimensions of 25 mm×25 mm or 25 mm×75 mm.

Example 18

Formation of Luminescent Material

Processing conditions similar to those described in Example 11 are used, but with multiple overcoat layers of $Al_2O_3$. A typical time period between depositing each overcoat layer is from 1 minute to 2 minutes.

Example 19

Formation of Luminescent Material

Processing conditions similar to those described in Example 12 are used, but with multiple overcoat layers of SiO$_2$. A typical time period between depositing each overcoat layer is from 1 minute to 2 minutes.

Example 20

Characterization of Luminescent Material

Figure 7:
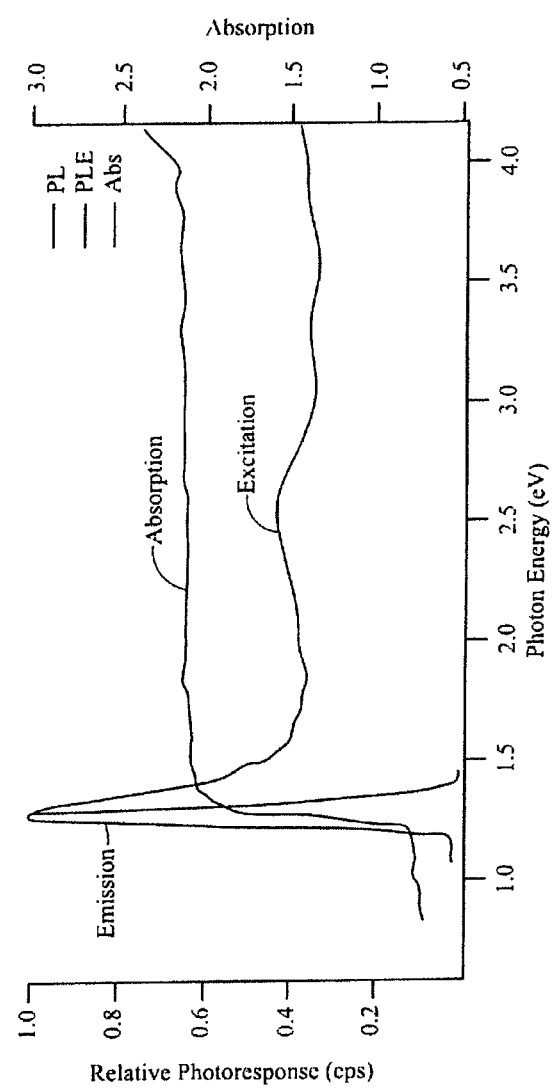
FIG. 7 illustrates spectra of a luminescent material, according to an embodiment of the invention.

A luminescent material including cesium, tin, and iodine was prepared, and optical characteristics of the luminescent material were measured in accordance with standard techniques. FIG. 7 illustrates an emission spectrum and an excitation spectrum that were obtained for a range of photon energies expressed in electron volts ("eV"). As can be appreciated with reference to FIG. 7, the luminescent material emitted light with high intensities, with a narrow spectral width of less than about 50 meV at FWHM, and with a peak emission wavelength of about 930 nm. Also, these photoluminescent characteristics were relatively insensitive to changes in excitation wavelength from the ultraviolet range to the emission band. These photoluminescent characteristics are unlike those of a standard CsI doped with tin, which typically emits light with shorter wavelengths, such as in the blue region or in the ultraviolet range. Absorption characteristics of the luminescent material were also measured in accordance with standard techniques. In particular, an absorption spectrum of the luminescent material was obtained and is superimposed onto the spectra illustrated in FIG. 7. As can be appreciated with reference to FIG. 7, the emission band of the luminescent material is located at or near the absorption band edge.

Example 21

Characterization of Luminescent Material

Figure 8:
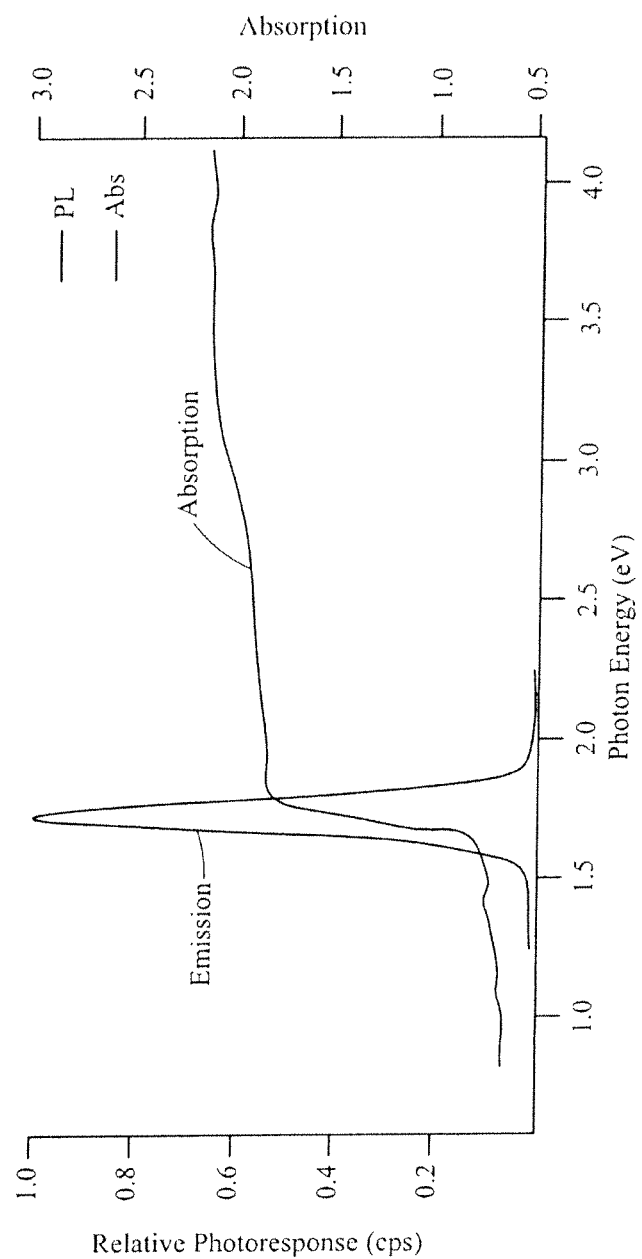
FIG. 8 illustrates spectra of another luminescent material, according to an embodiment of the invention.

A luminescent material including cesium, tin, and bromine was prepared, and optical characteristics of the luminescent material were measured in accordance with standard techniques. FIG. 8 illustrates an emission spectrum that was obtained for a range of photon energies. As can be appreciated with reference to FIG. 8, the luminescent material emitted light with high intensities, with a narrow spectral width, and with a peak emission wavelength of about 700 nm. These photoluminescent characteristics are unlike those of a standard CsBr doped with tin, which typically emits light with shorter wavelengths, such as in the blue region or in the ultraviolet range. Absorption characteristics of the luminescent material were also measured in accordance with standard techniques. In particular, an absorption spectrum of the luminescent material was obtained and is superimposed onto the spectrum illustrated in FIG. 8. As can be appreciated with reference to FIG. 8, the emission band of the luminescent material is located at or near the absorption band edge.

Example 22

Characterization of Luminescent Material

Figure 9:
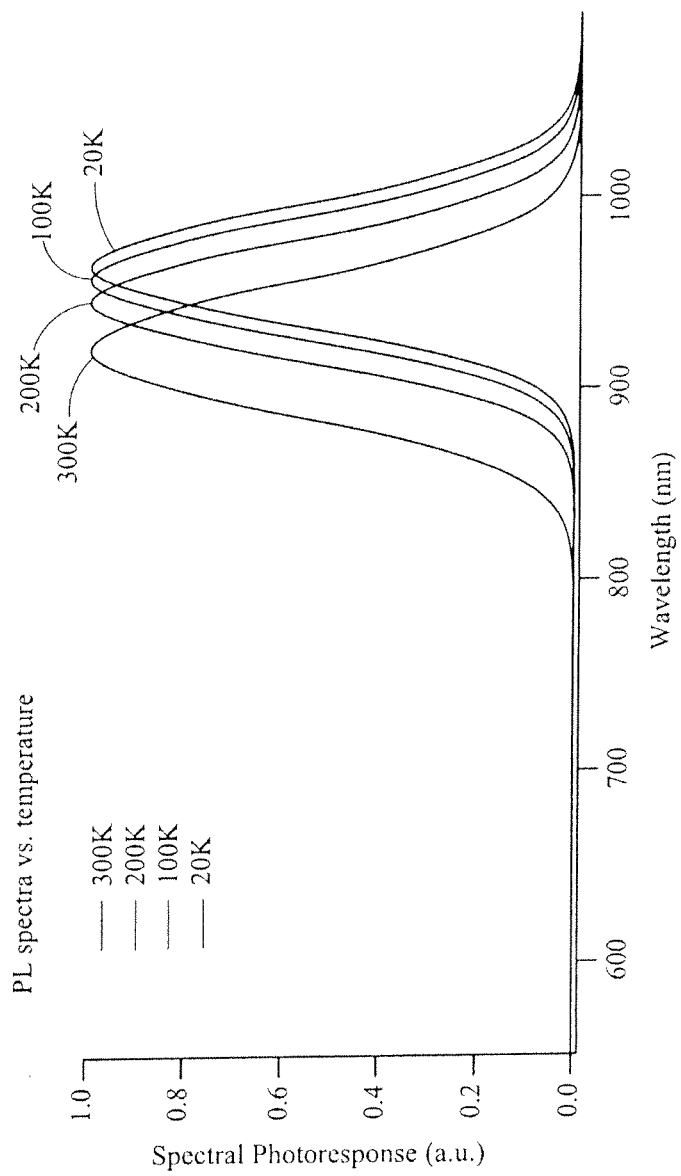
FIG. 9 illustrates emission spectra of a luminescent material for a range of temperatures, according to an embodiment of the invention.

A luminescent material including cesium, tin, and iodine was prepared, and optical characteristics of the luminescent material were measured at different temperatures. FIG. 9 illustrates emission spectra that were obtained for a range of temperatures. As can be appreciated with reference to FIG. 9, a peak emission wavelength of the luminescent material decreased with increasing temperature. This variation of the peak emission wavelength with temperature is unlike that of many standard materials, which typically have a peak emission wavelength that increases with increasing temperature.

Example 23

Characterization of Luminescent Material

Figure 10:
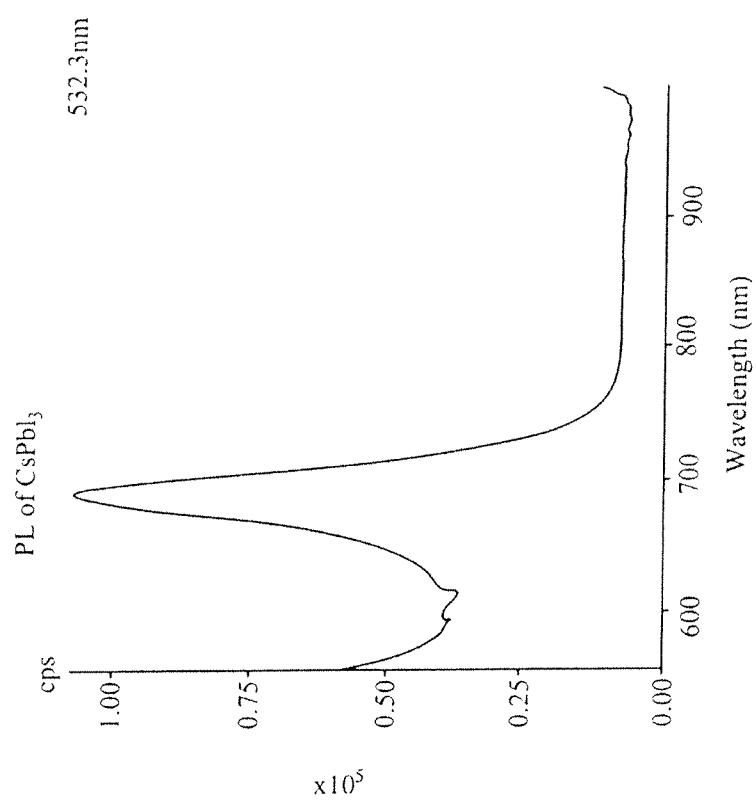
FIG. 10 illustrates an emission spectrum of a luminescent material including cesium, lead(II), and iodine, according to an embodiment of the invention.

A luminescent material including cesium, lead(II), and iodine (CsPbI$_3$) was prepared, and optical characteristics of the luminescent material were measured in accordance with standard techniques. FIG. 10 illustrates an emission spectrum that was obtained for a range of wavelengths. As can be appreciated with reference to FIG. 10, the luminescent material emitted light with high intensities, with a narrow spectral width, and with a peak emission wavelength of about 700 nm.

Example 24

Characterization of Luminescent Material

Figure 11:
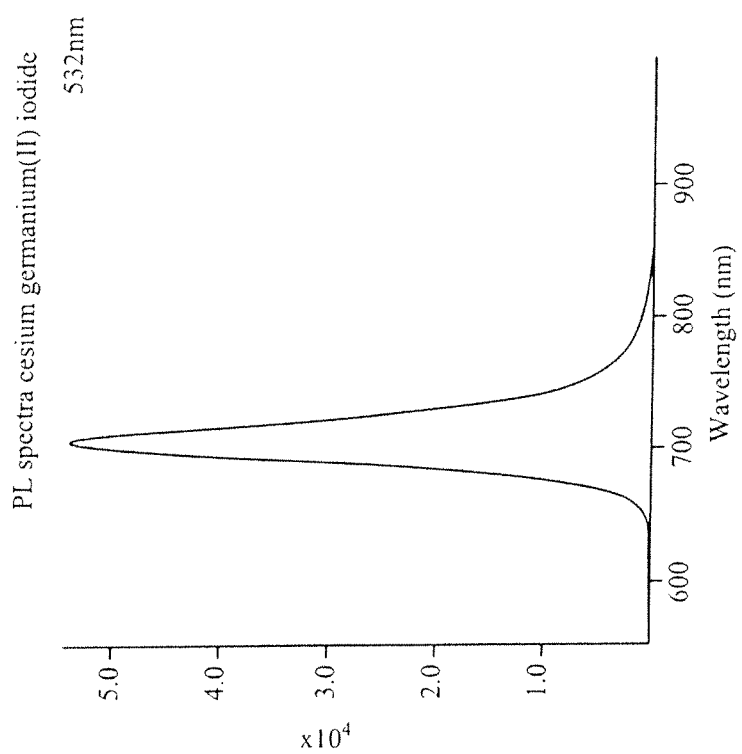
FIG. 11 illustrates an emission spectrum of a luminescent material including cesium, germanium(II), and iodine, according to an embodiment of the invention.

A luminescent material including cesium, germanium(II), and iodine was prepared, and optical characteristics of the luminescent material were measured in accordance with standard techniques. FIG. 11 illustrates an emission spectrum that was obtained for a range of wavelengths. As can be appreciated with reference to FIG. 11, the luminescent material emitted light with high intensities, with a narrow spectral width, and with a peak emission wavelength of about 700 nm.

Example 25

Characterization of Luminescent Material

Figure 12:
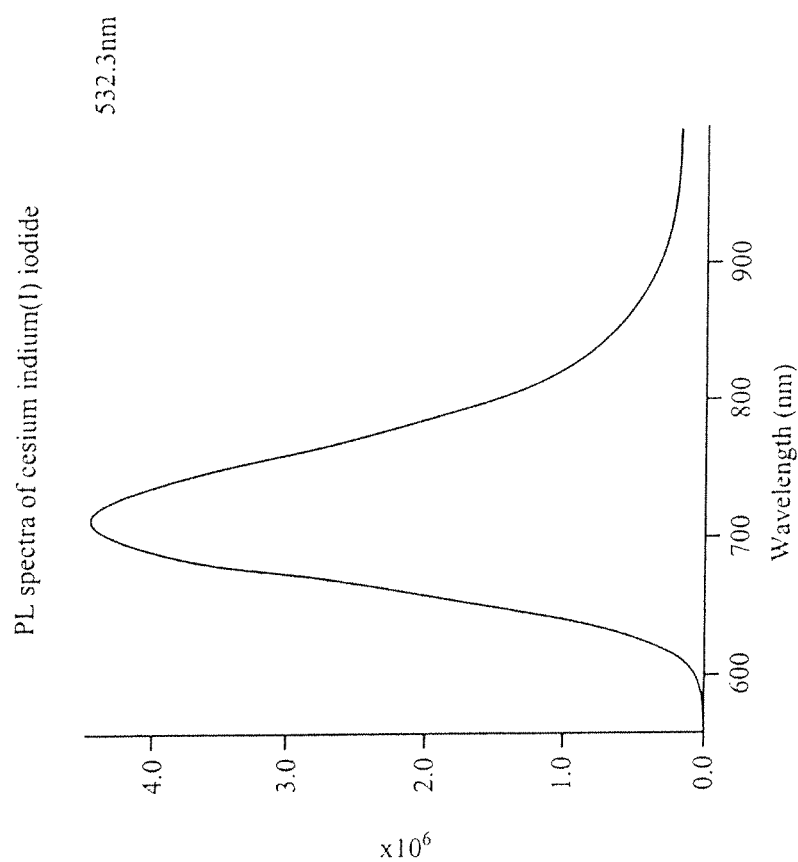
FIG. 12 illustrates an emission spectrum of a luminescent material including cesium, indium(I), and iodine, according to an embodiment of the invention.

A luminescent material with B being a non-Group IVB element was sometimes observed to have a greater spectral width. In particular, the luminescent material including cesium, indium(I), and iodine was prepared, and optical characteristics of the luminescent material were measured in accordance with standard techniques. FIG. 12 illustrates an emission spectrum that was obtained for a range of wavelengths. As can be appreciated with reference to FIG. 12, the luminescent material emitted light with a spectral width that was greater than 100 meV. An excitation spectrum (not illustrated in FIG. 12) was observed to include a set of narrow bands within a range of excitation wavelengths.

Example 26

Formation and Characterization of Luminescent Material

Figure 13:
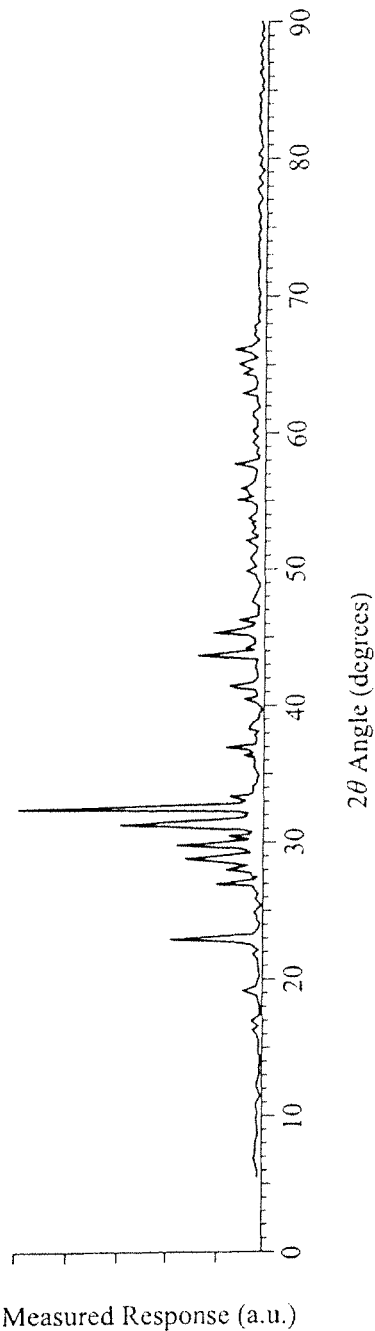
FIG. 13 illustrates a X-ray Diffraction ("XRD") pattern of a luminescent material, according to an embodiment of the invention.
Figure 14A:
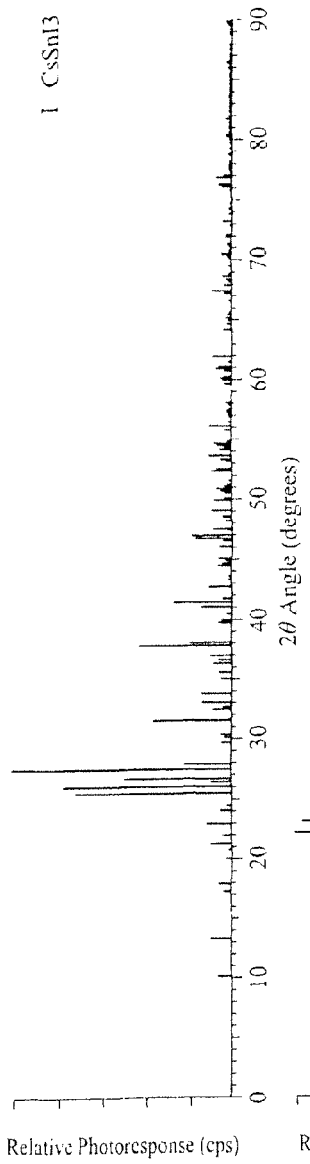
FIG. 14A through FIG. 14C illustrate XRD patterns of various standard materials.
Figure 14B:
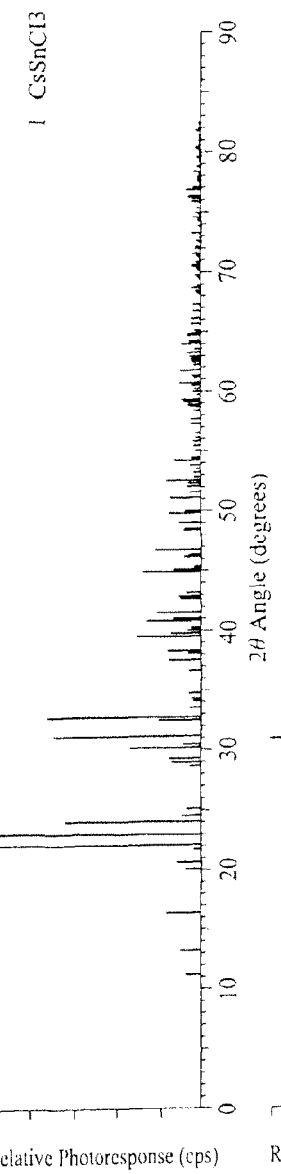
Figure 14C:
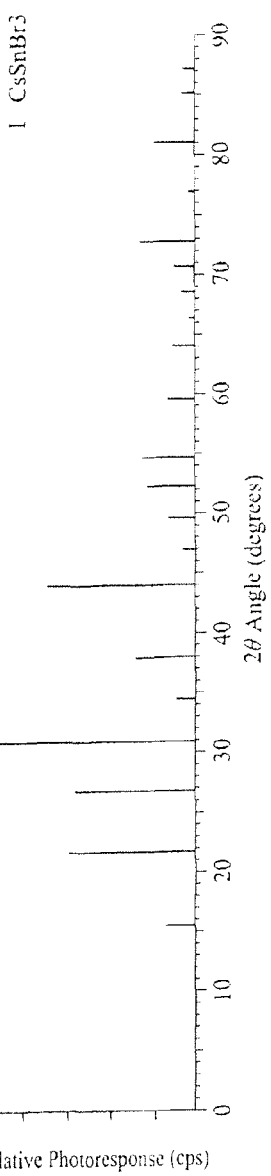

Processing conditions similar to those described in Example 1 were used to prepare a luminescent material including cesium, tin, and iodine, and the luminescent material was characterized in accordance with standard X-ray Diffraction ("XRD") techniques. FIG. 13 illustrates a XRD pattern that was obtained for the luminescent material. The XRD pattern of the luminescent material was compared with XRD patterns of various standard materials, including a standard CsSnI$_3$ (illustrated in FIG. 14A), a standard CsSnCl$_3$ (illustrated in FIG. 14B), and a standard CsSnBr$_3$ (illustrated in FIG. 14C), and did not produce a match. Differences in the XRD patterns indicate that the luminescent material has a different microstructure relative to the standard materials.

The luminescent material was also characterized using a microscope. The luminescent material was observed to emit light in the near infrared range, and appeared crystalline under the microscope. When illuminated with 633 nm laser light, the luminescent material appeared bright when viewed with an infrared camera sensitive to wavelengths in the range of 850 nm to 1,000 nm.

A practitioner of ordinary skill in the art requires no additional explanation in developing the solar modules described herein but may nevertheless find some helpful guidance regarding the formation and processing of PV cells by examining the following references: U.S. Pat. No. 7,169,669, entitled "Method of Making Thin Silicon Sheets for Solar Cells" and issued on Jan. 30, 2007; and U.S. Patent Application Publication No. 2005/0272225, entitled "Semiconductor Processing" and published on Dec. 8, 2005, the disclosures of which are incorporated herein by reference in their entireties. A practitioner of ordinary skill in the art may also find some helpful guidance regarding spectral concentration by examining the following references. U.S. Pat. No. 4,227,939, entitled "Luminescent Solar Energy Concentrator Devices" and issued on Oct. 14, 1980; and A. H. Zewali, "Photon Trapping and Energy transfer in Multiple-Dye Plastic Matrices: an Efficient Solar-Energy Concentrator;" Optics Letters, Vol. 1, p. 73 (1977), the disclosures of which are incorporated herein by reference in their entireties.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method) or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A solar module comprising:
  an active layer including a set of photovoltaic cells; and
  a spectral concentrator optically coupled to the active layer and including a luminescent material that exhibits photoluminescence in response to incident solar radiation, the photoluminescence having: (a) a quantum efficiency of at least 30 percent; (b) a spectral width no greater than 100 nm at Full Width at Half Maximum; and (c) a peak emission wavelength in the near infrared range, the spectral concentrator being configured to convert the incident solar radiation into emitted radiation that is directed towards the active layer,
  wherein the active layer further includes an encapsulant, and the set of photovoltaic cells are embedded within the encapsulant, and
  wherein the active layer includes a top surface and a bottom surface, the set of photovoltaic cells are disposed between the top surface and the bottom surface, each of the set of photovoltaic cells is bifacial and is configured to accept and absorb radiation at a top surface and a bottom surface of the photovoltaic cell, and each of the set of photovoltaic cells includes a p-n junction region that extends in a substantially perpendicular direction to the top surface of the active layer, and the solar module further comprises:
  a first substrate layer adjacent to the top surface of the active layer;
  a second substrate layer adjacent to the bottom surface of the active layer, wherein the first substrate layer includes a top surface, the second substrate layer includes a bottom surface, the spectral concentrator is adjacent to the bottom surface of the second substrate layer, the second substrate layer is disposed between the active layer and the spectral concentrator; and
  an anti-reflection coating adjacent to the top surface of the first substrate layer.

2. A solar module comprising:
  an active layer including a set of photovoltaic cells; and
  a spectral concentrator optically coupled to the active layer and including a luminescent material that exhibits photoluminescence in response to incident solar radiation, the photoluminescence having: (a) a quantum efficiency of at least 30 percent; (b) a spectral width no greater than 100 nm at Full Width at Half Maximum; and (c) a peak emission wavelength in the near infrared range, the spectral concentrator being configured to convert the incident solar radiation into emitted radiation that is directed towards the active layer,
  wherein the active layer further includes an encapsulant, and the set of photovoltaic cells are embedded within the encapsulant, and
  wherein the active layer includes a top surface and a bottom surface, the set of photovoltaic cells are disposed between the top surface and the bottom surface, each of the set of photovoltaic cells is bifacial and is configured to accept and absorb radiation at a top surface and a bottom surface of the photovoltaic cell, and each of the set of photovoltaic cells includes a p-n junction region that extends in a substantially perpendicular direction to the top surface of the active layer, and the solar module further comprises:
  a first substrate layer adjacent to the top surface of the active layer;
  a second substrate layer adjacent to the bottom surface of the active layer, wherein the first substrate layer includes a top surface, the second substrate layer includes a bottom surface, the spectral concentrator includes a top surface, the spectral concentrator is adjacent to the top surface of the first substrate layer, the first substrate layer is disposed between the active layer and the spectral concentrator;
  an anti-reflection coating adjacent to the top surface of the spectral concentrator; and
  a Lambertian reflector adjacent to the bottom surface of the second substrate layer.

3. The solar module of either claim 1 or claim 2, wherein the quantum efficiency is at least 40 percent, the spectral width is no greater than 80 nm at Full Width at Half Maximum, and the peak emission wavelength is in the range of 900 nm to 1 μm.

4. The solar module of either claim 1 or claim 2, wherein the luminescent material is selected from InP, $Zn_3P_2$, $Cu_2O$, CuO, CuInGaS, and CuInGaSe.

5. A solar module comprising:
  an active layer including multiple photovoltaic cells;
  a first substrate layer adjacent to the active layer and including a first surface facing away from the active layer;
  a second substrate layer adjacent to the active layer and including a second surface facing away from the active layer, the active layer being disposed between the first substrate layer and the second substrate layer;

a first luminescent layer adjacent to the first surface of the first substrate layer, the first luminescent layer being configured to convert a first fraction of incident solar radiation into first emitted radiation that is substantially monochromatic and is directed towards the active layer; and a second luminescent layer adjacent to the second surface of the second substrate layer, the second luminescent layer being configured to convert a second fraction of the incident solar radiation into second emitted radiation that is substantially monochromatic and is directed towards the active layer, wherein the photovoltaic cells are spaced apart within the active layer to provide passage of the second fraction of the incident solar radiation towards the second luminescent layer, and each of the photovoltaic cells is bifacial and is configured to accept and absorb light at a first surface and an opposing, second surface of the photovoltaic cell, and each of the photovoltaic cells includes a p-n junction region that extends in a substantially perpendicular direction to the first surface of the first substrate layer.

6. The solar module of claim 5, wherein the first luminescent layer is configured to perform down-conversion with a bandgap energy $E_{g1}$, and the second luminescent layer is configured to perform up-conversion with a bandgap energy $E_{g2}$.

7. The solar module of claim 6, wherein each of the bandgap energy $E_{g1}$ and the bandgap energy $E_{g2}$ substantially corresponds to a bandgap energy of the photovoltaic cells.

8. The solar module of claim 5, wherein the first luminescent layer is configured to perform down-conversion with a bandgap energy $E_{g1}$, the second luminescent layer is configured to perform down-conversion with a bandgap energy $E_{g2}$, and the bandgap energy $E_{g2}$ is smaller than the bandgap energy $E_{g1}$.

9. The solar module of claim 8, wherein the bandgap energy $E_{g1}$ substantially corresponds to a first bandgap energy of the photovoltaic cells, and the bandgap energy $E_{g2}$ substantially corresponds to a second bandgap energy of the photovoltaic cells.

10. The solar module of claim 5, wherein a thickness of at least one of the first luminescent layer and the second luminescent layer is in the range of 0.1 μm to 10 μm.

11. The solar module of claim 5, wherein the first luminescent layer includes a third surface facing away from the first substrate layer, and the solar module further comprises:
an anti-reflection coating adjacent to the third surface of the first luminescent layer.

12. The solar module of claim 11, wherein the anti-reflection coating includes a bandstop reflector to reflect at least one of the first emitted radiation and the second emitted radiation towards the active layer.

13. A solar module comprising:
a substrate layer including a first surface and a second surface;
an anti-reflection coating adjacent to the first surface of the substrate layer; and
an active layer adjacent to the second surface of the substrate layer, the active layer including
an encapsulant including a luminescent material that exhibits photoluminescence in response to incident solar radiation, and
a set of photovoltaic cells disposed within the encapsulant,
wherein the luminescent material has the formula:

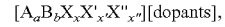

A is cesium;

B is tin;

X, X', and X" are selected from fluorine, chlorine, bromine, and iodine, and at least one of X, X', and X" is iodine;

a is in the range of 1 to 9;

b is in the range of 1 to 5;

x, x', and x" have a sum in the range of 1 to 9; and the dopants are included in the luminescent material in an amount less than 5 percent in terms of elemental composition.

14. The solar module of claim 13, wherein the anti-reflection coating includes a bandstop reflector to reflect emitted radiation produced based on the photoluminescence.

15. The solar module of claim 13, wherein the active layer includes a third surface facing away from the substrate layer, and the solar module further comprises:
a Lambertian reflector adjacent to the third surface of the active layer.

16. The solar module of claim 13, wherein a is 1, and b is 1.

17. The solar module of claim 13, wherein a is 1, and b is 2.

18. The solar module of claim 13, wherein a is in the range of 1 to 5, b is in the range of 1 to 3, and the sum of x, x', and x" is in the range of 1 to 5.

19. The solar module of claim 13, wherein a is 1, and the sum of x, x', and x" is 1+2b.

20. The solar module of claim 13, wherein the dopants are selected from oxygen ($O^{-2}$), fluorine ($F^{-1}$), chlorine ($Cl^{-1}$), bromine ($Br^{-1}$), iodine ($I^{-1}$), thiocyanate ($SCN^{-1}$), orthophosphate ($PO_4^{-3}$), metaphosphate ($PO_3^{-1}$), pyrophosphate ($P_2O_7^{-4}$), and tin ($Sn^{+4}$).

21. The solar module of claim 13, wherein the luminescent material has a perovskite-based microstructure, and the dopants are dispersed within the perovskite-based microstructure.

* * * * *